US008367310B2

(12) United States Patent
Watanabe et al.

(10) Patent No.: US 8,367,310 B2
(45) Date of Patent: Feb. 5, 2013

(54) PATTERN FORMING PROCESS AND RESIST-MODIFYING COMPOSITION

(75) Inventors: Takeru Watanabe, Joetsu (JP); Masashi Iio, Joetsu (JP); Jun Hatakeyama, Joetsu (JP); Tsunehiro Nishi, Joetsu (JP); Yoshio Kawai, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 353 days.

(21) Appl. No.: 12/708,196

(22) Filed: Feb. 18, 2010

(65) Prior Publication Data

US 2010/0209849 A1 Aug. 19, 2010

(30) Foreign Application Priority Data

Feb. 18, 2009 (JP) ................................. 2009-035367

(51) Int. Cl.
G03F 7/26 (2006.01)
(52) U.S. Cl. .................... 430/324; 430/315; 430/394
(58) Field of Classification Search .................. 430/312, 430/322, 315, 324, 326, 327, 330, 394
See application file for complete search history.

(56) References Cited

U.S. PATENT DOCUMENTS

| 5,374,502 | A | 12/1994 | Tanaka et al. | |
|---|---|---|---|---|
| 6,312,867 | B1 | 11/2001 | Kinsho et al. | |
| 7,285,375 | B2 | 10/2007 | Matsumura et al. | |
| 7,537,880 | B2 | 5/2009 | Harada et al. | |
| 2007/0231738 | A1 | 10/2007 | Kaneko et al. | |
| 2008/0090172 | A1 | 4/2008 | Hatakeyama et al. | |
| 2008/0199814 | A1 | 8/2008 | Brzozowy et al. | |
| 2009/0053657 | A1* | 2/2009 | Hatakeyama et al. | 430/324 |
| 2010/0028809 | A1 | 2/2010 | Vanleenhove et al. | |
| 2010/0086878 | A1* | 4/2010 | Hatakeyama et al. | 430/324 |
| 2010/0159392 | A1* | 6/2010 | Hatakeyama et al. | 430/286.1 |

FOREIGN PATENT DOCUMENTS

| EP | 2092393 A2 | 8/2009 |
|---|---|---|
| EP | 2128706 A1 | 12/2009 |
| JP | 6-105683 B | 12/1994 |
| JP | 7-142349 A | 6/1995 |
| JP | 2000-336121 A | 12/2000 |
| JP | 2003-055362 A | 2/2003 |
| JP | 2005-008847 A | 1/2005 |
| JP | 2005-018012 A | 1/2005 |
| JP | 2005-248169 A | 9/2005 |
| JP | 2007-297590 A | 11/2007 |
| JP | 2008-033174 A | 2/2008 |
| JP | 2008-078220 A | 4/2008 |
| JP | 2008-083537 A | 4/2008 |
| JP | 2008-111103 A | 5/2008 |
| JP | 2008-122932 A | 5/2008 |
| JP | 2008-152130 A | 7/2008 |
| JP | 2008-192774 A | 8/2008 |
| WO | 2008/059440 A2 | 5/2008 |
| WO | 2008/070060 A2 | 6/2008 |
| WO | 2008/114644 A1 | 9/2008 |

OTHER PUBLICATIONS

David J. Abdallah et al. "A Novel Resist Freeze Process for Double Imaging", Journal of Photopolymer Science and Technology, 2008, pp. 655-663, vol. 21, No. 5.
Nikolaos Bekiaris et al. "A Lithographic and Process Assessment of Photoresist Stabilization for Double-Patterning using 172 nm Photoresist Curing", Proceedings of SPIE, 2008, pp. 692321-1-692321-8, vol. 6923.
Kuang-Jung Rex Chen et al. "Resist Freezing Process for Double Exposure Lithography", Proceedings fo SPIE, 2008, pp. 69230G-1-69230G-10, vol. 6923.
Masafumi Hori et al. "Sub-40nm Half-Pitch Double Patterning with Resist Freezing Process", Proceedings of SPIE, 2008, pp. 69230H-1-69230H-8, vol. 6923.
Stephen Hsu et al. "Double Exposure Technique for 45nm node and Beyond", Proceedings of SPIE, 2005, pp. 59921Q-1-59921Q-16, vol. 5992.
B. J. Lin "Semiconductor Foundry, Lithography and Partners", Proceedings of SPIE, 2002, pp. xxix, vol. 4690.
Hiroko Nakamura et al. "Ion Implantation as Insoluble Treatment for Resist Stacking Process", Proceedings of SPIE, 2008, pp. 692322-1-692322-12, vol. 6923.
Soichi Owa et al. "Immersion Lithography; Its Potential Performance and Issues" Optical Microlithography XVI, Proceedings of SPIE, 2003, pp. 724, vol. 5040.
Satoru Shimura et al. "Advanced Resist Process Enabling Implementation of CD Controllability for 32nm and Beyond", Proceedings of SPIE, 2008, pp. 69233C-1-69233C-6, vol. 6923.

* cited by examiner

Primary Examiner — Anca Eoff

(57) ABSTRACT

A patterning process includes (1) coating and baking a first positive resist composition to form a first resist film, exposing, post-exposure baking, and alkali developing to form a first resist pattern, (2) applying a resist-modifying composition to the first resist pattern and heating to modify the first resist pattern, (3) coating and baking a second positive resist composition to form a second resist film, exposing, post-exposure baking, and alkali developing to form a second resist pattern. The modified first resist film has a contact angle with pure water of 50°-85°.

6 Claims, 5 Drawing Sheets

COAT PHOTORESIST

EXPOSE AND DEVELOP PHOTORESIST

MODIFYING TREATMENT FOR INACTIVATION

COAT, EXPOSE AND DEVELOP 2ND PHOTORESIST

ETCH HARD MASK

ETCH PROCESSABLE LAYER

COAT PHOTORESIST

EXPOSE AND DEVELOP PHOTORESIST

ETCH HARD MASK 1

COAT, EXPOSE AND DEVELOP 2ND PHOTORESIST

ETCH HARD MASK 2

ETCH PROCESSABLE LAYER

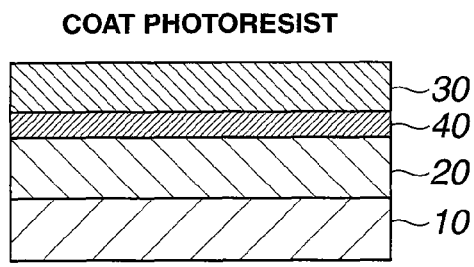
FIG.4A PRIOR ART — COAT PHOTORESIST
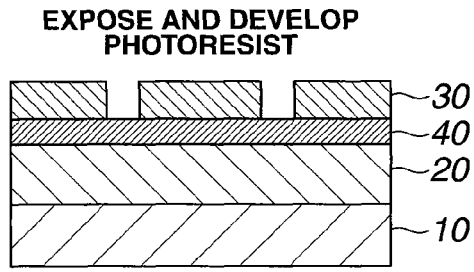
FIG.4B PRIOR ART — EXPOSE AND DEVELOP PHOTORESIST
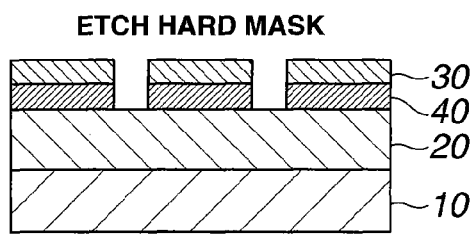
FIG.4C PRIOR ART — ETCH HARD MASK
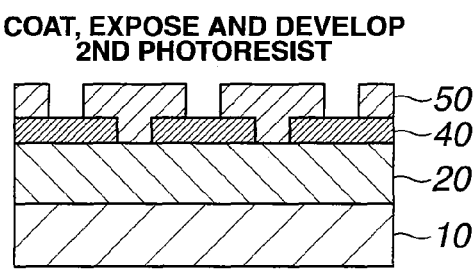
FIG.4D PRIOR ART — COAT, EXPOSE AND DEVELOP 2ND PHOTORESIST
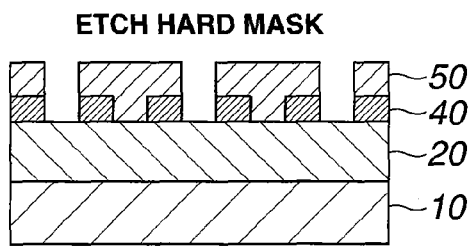
FIG.4E PRIOR ART — ETCH HARD MASK
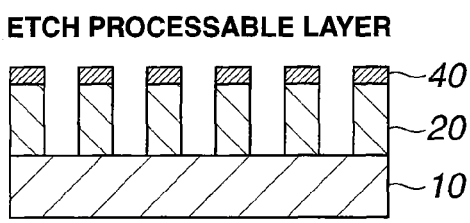
FIG.4F PRIOR ART — ETCH PROCESSABLE LAYER

PATTERN FORMING PROCESS AND RESIST-MODIFYING COMPOSITION

CROSS-REFERENCE TO RELATED APPLICATION

This non-provisional application claims priority under 35 U.S.C. §119(a) on Patent Application No. 2009-035367 filed in Japan on Feb. 18, 2009, the entire contents of which are hereby incorporated by reference.

TECHNICAL FIELD

This invention relates to a patterning process involving the steps of forming a first resist pattern from a first resist film through first exposure, treating the first resist pattern with a resist-modifying composition for inactivation to a second resist process, and forming a second resist pattern while retaining the first resist pattern so that the second line pattern is formed in spaces of the first line pattern for thereby reducing the distance between pattern lines. It also relates to a resist-modifying composition used in the process.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. While a number of light sources are used in the lithography for resist pattern formation, photolithography using ArF excimer laser (193 nm) has been under active investigation over a decade. The full application of ArF lithography started from the 90-nm node. The ArF lithography combined with a lens having an increased numerical aperture (NA) of 0.9 is considered to comply with 65-nm node devices. For the manufacture of next 45-nm node devices, the early introduction of ArF immersion lithography was advocated (see Proc. SPIE, Vol. 4690 xxix, 2002).

In the ArF immersion lithography, the space between the projection lens and the wafer is filled with water. Since water has a refractive index of 1.44 at 193 nm, design of a lens having a numerical aperture (NA) of 1.0 or greater is possible in principle. Proposal of a catadioptric system accelerated the lens design to a NA of 1.0 or greater. A combination of a lens having NA of 1.2 or greater with strong resolution enhancement technology suggests a way to the 45-nm node (see Proc. SPIE, Vol. 5040, p 724, 2003). Efforts have also been made to develop lenses of NA 1.35.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line width roughness (LWR) of resist film, defect-free MoSi laminate mask, reduced aberration of reflection mirror, and the like.

The water immersion lithography using a NA 1.35 lens achieves an ultimate resolution of 40 to 38 nm at the maximum NA, but cannot reach 32 nm. Efforts have been made to develop higher refractive index materials in order to further increase NA. It is the minimum refractive index among projection lens, liquid, and resist film that determines the NA limit of lenses. In the case of water immersion, the refractive index of water is the lowest in comparison with the projection lens (refractive index 1.5 for synthetic quartz) and the resist film (refractive index 1.7 for prior art methacrylate-based film). Thus the NA of projection lens is determined by the refractive index of water. Recent efforts succeeded in developing a highly transparent liquid having a refractive index of 1.65. In this situation, the refractive index of projection lens made of synthetic quartz is the lowest, suggesting a need to develop a projection lens material with a higher refractive index. LuAG (lutetium aluminum garnet $Lu_3Al_5O_{12}$) having a refractive index of at least 2 is the most promising material, but has the problems of birefringence and noticeable absorption. Even if a projection lens material with a refractive index of 1.8 or greater is developed, the liquid with a refractive index of 1.65 limits the NA to 1.55 at most, failing in resolution of 32 nm. For resolution of 32 nm, a liquid with a refractive index of 1.8 or greater is necessary. Such a liquid material has not been discovered because a tradeoff between absorption and refractive index is recognized in the art. In the case of alkane compounds, bridged cyclic compounds are preferred to linear ones in order to increase the refractive index, but the cyclic compounds undesirably have too high a viscosity to follow high-speed scanning on the exposure tool stage. If a liquid with a refractive index of 1.8 is developed, then the component having the lowest refractive index is the resist film, suggesting a need to increase the refractive index of a resist film to 1.8 or higher.

The process that now draws attention under the above-discussed circumstances is a double patterning process involving a first set of exposure and development to form a first pattern and a second set of exposure and development to form a pattern in spaces of the first pattern. See Proc. SPIE, Vol. 5992, 59921Q-1-16 (2005). A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure pattern, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

While the former process requires two applications of hard mask, the latter process uses only one layer of hard mask, but requires to form a trench pattern which is difficult to resolve as compared with the line pattern. The latter process includes the use of a negative resist material in forming the trench pattern. This allows for use of high contrast light as in the formation of lines as a positive pattern. However, since the negative resist material has a lower dissolution contrast than the positive resist material, a comparison of the formation of lines from the positive resist material with the formation of a trench pattern of the same size from the negative resist material reveals that the resolution achieved with the negative resist material is lower. After a wide trench pattern is formed from the positive resist material by the latter process, there may be applied a thermal flow method of heating the substrate for shrinkage of the trench pattern, or a RELACS method of coating a water-soluble film on the trench pattern as developed and heating to thicken the resist for achieving shrinkage of the trench pattern. These have the drawbacks that the proximity bias is degraded and the process is further complicated, leading to reduced throughputs.

Both the former and latter processes require two etchings for substrate processing, leaving the issues of a reduced throughput and deformation and misregistration of the pattern by two etchings.

One method that proceeds with a single etching is by using a negative resist material in a first exposure and a positive resist material in a second exposure. Another method is by using a positive resist material in a first exposure and a negative resist material in an alcohol that does not dissolve away the positive resist material in a second exposure. Since negative resist materials with low resolution are used, these methods entail degradation of resolution (see JP-A 2008-078220).

The critical issue associated with double patterning is an overlay accuracy between first and second patterns. Since the magnitude of misregistration is reflected by a variation of line size, an attempt to form 32-nm lines at an accuracy of 10%, for example, requires an overlay accuracy within 3.2 nm. Since currently available scanners have an overlay accuracy of the order of 8 nm, a significant improvement in accuracy is necessary.

Now under investigation is the resist pattern freezing technology involving forming a first resist pattern on a substrate, taking any suitable means for inactivating the resist pattern to a second resist process, applying a second resist thereon, and forming a second resist pattern in space portions of the first resist pattern. With this freezing technology, etching of the substrate is required only once, leading to improved throughputs and avoiding the problems of pattern deformation and misregistration due to stresses in the hard mask during etching.

With respect to the freezing technology, one basic idea is proposed in WO 2008/059440. Known variants of the freezing technology include thermal insolubilization (Proc. SPIE Vol. 6923, p 69230G (2008)); coating of a cover film and thermal insolubilization (Proc. SPIE Vol. 6923, p 69230H (2008)); insolubilization by illumination of light having an extremely short wavelength, for example, 172 nm wavelength (Proc. SPIE Vol. 6923, p 692321 (2008)); insolubilization by ion implantation (Proc. SPIE Vol. 6923, p 692322 (2008)); insolubilization through formation of thin-film oxide film by CVD; insolubilization by light illumination and special gas treatment (Proc. SPIE Vol. 6923, p 69233C1 (2008)); insolubilization of a resist pattern by treatment of resist pattern surface with a metal alkoxide or metal halide (e.g., titanium, zirconium or aluminum) or an isocyanate-containing silane compound (JP-A 2008-033174); insolubilization of a resist pattern by coating its surface with a water-soluble resin and a water-soluble crosslinker (JP-A 2008-083537); insolubilization by ethylene diamine gas and baking (J. Photopolym. Sci. Technol., Vol. 21, No. 5, p 655 (2008)); insolubilization by coating of an amine-containing solution and hard-baking for crosslinking (WO 2008/070060); and insolubilization of resist pattern by treatment with a mixture of a polar resin containing amide or analogous groups and a crosslinker (WO 2008/114644).

JP-A 2008-192774 discloses a method including insolubilizing a first resist pattern by application of radiation and heat, coating the insolubilized pattern with a resist solution comprising a base polymer comprising recurring units having hexafluoroalcohol groups and acid labile groups in an alcohol solvent, and forming a second resist pattern therefrom.

Of these insolubilizing techniques, the technique of using a solution containing a resin as an insolubilizing agent is currently regarded promising. None of the materials and processes proposed thus far meet satisfactory freezing performance, retention of fine line pattern during development, and defect performance. It would be desirable to have a process and material capable of meeting such requirements.

CITATION LIST

Patent Document 1: JP-A 2008-078220
Patent Document 2: WO 2008/059440
Patent Document 3: JP-A 2008-033174
Patent Document 4: JP-A 2008-083537
Patent Document 5: WO 2008/070060
Patent Document 6: WO 2008/114644
Patent Document 7: JP-A 2008-192774
Non-Patent Document 1: Proc. SPIE, Vol. 4690, xxix, (2002)
Non-Patent Document 2: Proc. SPIE, Vol. 5040, p 724, (2003)
Non-Patent Document 3: Proc. SPIE, Vol. 5992, 59921Q-1-16, (2005)
Non-Patent Document 4: Proc. SPIE, Vol. 6923, p 69230G (2008)
Non-Patent Document 5: Proc. SPIE, Vol. 6923, p 69230H (2008)
Non-Patent Document 6: Proc. SPIE, Vol. 6923, p 692321 (2008)
Non-Patent Document 7: Proc. SPIE, Vol. 6923, p 692322 (2008)
Non-Patent Document 8: Proc. SPIE, Vol. 6923, p 69233C1 (2008)
Non-Patent Document 9: J. Photopolym. Sci. Technol., Vol. 21, No. 5, p 655 (2008)

SUMMARY OF INVENTION

It is understood that when substrate processing is carried out by double dry etchings using resist patterns fabricated by double exposures and developments, the throughput is reduced to one half. Also an issue of pattern misregistration by dry etchings occurs.

The known methods of insolubilizing resist pattern are difficult to meet all the requirements of satisfactory retention of first pattern, prevention of fine line pattern from collapsing, and development defect performance.

Therefore, an object of the invention is to provide a pattern forming process in order to enable a double patterning process of processing a substrate by a single dry etching; specifically a pattern forming process comprising coating a first positive resist composition comprising a copolymer comprising recurring units having lactone as an adhesive group and recurring units having an acid labile group, effecting first exposure and development to form a first resist pattern (or first line pattern), treating the first resist pattern with a resist-modifying composition, specifically a resist-modifying composition comprising a base resin comprising fluorinated recurring units, a nitrogen-containing compound, and a solvent for inactivating the first resist pattern to a second resist process and endowing it with an adequate contact angle with pure water, then implementing the second resist process to form a second resist pattern composed mainly of lines parallel to the first line pattern, for thereby reducing the distance between pattern lines while preventing pattern collapse and minimizing development defects.

Another object of the invention is to provide a resist-modifying composition for use in the pattern forming process.

In one aspect, the invention provides a process for forming a pattern, comprising the steps of:

(1) coating a first positive resist composition comprising a polymer comprising recurring units adapted to increase alkali solubility under the action of acid and recurring units having lactone structure onto a substrate and baking to form a first resist film, exposing the first resist film to high-energy radiation, post-exposure baking, and developing the first resist film with an alkaline developer to form a first resist pattern composed mainly of lines, (2) applying a resist-modifying composition to the first resist pattern and heating to modify the first resist pattern, (3) coating a second positive resist composition onto the modified first resist pattern and baking to form a second resist film, exposing the second resist film to high-energy radiation, post-exposure baking, and developing the second resist film with an alkaline developer to form a second resist pattern composed mainly of lines parallel to the first resist pattern, for thereby reducing the distance between resist pattern lines, the first resist film in the unexposed area resulting from modifying step (2) having a contact angle with pure water of 50 to 85 degrees.

In a preferred embodiment, provided that the first resist film in the unexposed area prior to modifying step (2) having a contact angle with pure water of X degrees and the first resist film in the unexposed area resulting from modifying step (2) having a contact angle with pure water of Y degrees, the magnitude of the difference between X and Y is not more than 10 degrees, that is, $|X-Y| \leq 10$ deg.

Also preferably, the substrate after modifying step (2) has a contact angle with pure water of 45 to 85 degrees.

In a preferred embodiment, the resist-modifying composition comprises a base resin which is soluble in alkaline developer and non-soluble in water, the base resin having a fluorine atom content of 15 to 55% by weight, a nitrogen-containing organic compound, and a solvent.

In a more preferred embodiment, the base resin comprises recurring units having the general formula (1) or (2):

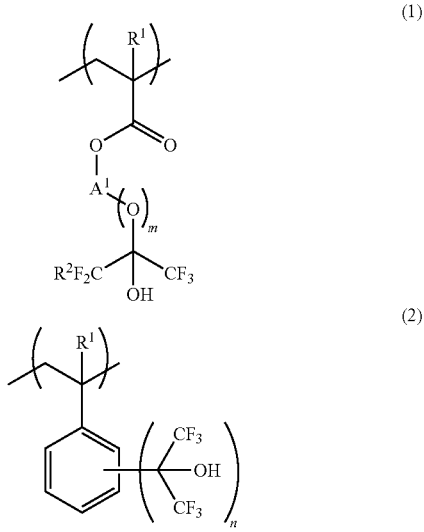

wherein $A^1$ is a straight, branched or cyclic $C_1$-$C_{15}$ alkylene or alkylidene group which may contain fluorine or hydroxyl or both, $R^1$ is hydrogen or methyl, $R^2$ is hydrogen or fluorine, or $R^2$ may be a single bond to $A^1$ wherein the moiety $A^1$-$(O)_m$—C—$CF_2$ is an alicyclic or ether ring, m is equal to 0 or 1, and n is equal to 1 or 2.

In a preferred embodiment, the base resin comprises recurring units having the general formula (1) or (2) and nitrogen-containing recurring units in an amount of up to 40 mol % based on the entire recurring units. The nitrogen-containing organic compound is typically an aminosilane compound or a non-silicon crosslinker.

In another aspect, the invention provides a resist-modifying composition for use in the pattern forming process defined above for modifying the first resist pattern. The resist-modifying composition comprises a base resin which is soluble in alkaline developer and non-soluble in water, a nitrogen-containing organic compound, and a solvent. The base resin comprises recurring units having the general formula (1) or (2) defined above and nitrogen-containing recurring units in an amount of up to 40 mol % based on the entire recurring units, and having a fluorine atom content of 15 to 55% by weight. The nitrogen-containing organic compound is an aminosilane compound having the general formula (3):

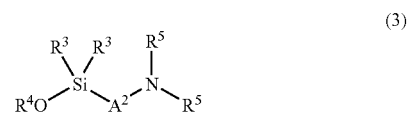

wherein $A^2$ is a straight, branched or cyclic $C_2$-$C_{20}$ alkylene group, $C_6$-$C_{15}$ arylene group or $C_7$-$C_{16}$ aralkylene group which may contain a hydroxyl, ether or amino group, $R^3$ is each independently $C_1$-$C_4$ alkyl or $OR^4$, $R^4$ is hydrogen or $C_1$-$C_6$ alkyl, $R^5$ is each independently hydrogen, or a $C_1$-$C_4$ alkyl group which may contain a hydroxyl or ether group, or two $R^5$ may bond together to form a ring with the nitrogen atom to which they are attached. In an alternative embodiment, the nitrogen-containing organic compound is a non-silicon crosslinker.

ADVANTAGEOUS EFFECTS OF INVENTION

The pattern forming process and the resist-modifying composition of the invention make it possible to implement a double patterning process of processing a substrate by two exposures and a single dry etching. In the double patterning process of forming a second resist line pattern in spaces of a first resist line pattern and parallel to the first resist line pattern for thereby reducing the distance between pattern lines, the invention prevents the pattern from collapsing and minimizes development defects.

BRIEF DESCRIPTION OF DRAWINGS

FIG. 1 is a cross-sectional view of a double patterning process according one embodiment of the invention.

FIG. 2 is a cross-sectional view of an exemplary prior art double patterning process.

FIG. 3 is a cross-sectional view of another exemplary prior art double patterning process.

FIG. 4 is a cross-sectional view of a further exemplary prior art double patterning process. FIG. 4A shows a laminate of substrate, processable layer, hard mask and resist film, FIG. 4B shows the resist film being exposed and developed, FIG. 4C shows the hard mask being etched, FIG. 4D shows, after removal of the first resist film, a second resist film being formed, exposed and developed, FIG. 4E shows the hard mask being etched, and FIG. 4F shows the processable layer being etched.

DESCRIPTION OF THE PREFERRED EMBODIMENT

Figure 1A:
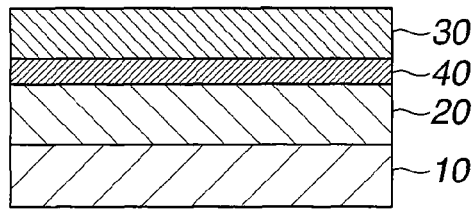
FIG. 1A shows a laminate of substrate, processable layer, hard mask and first resist film.
Figure 1B:
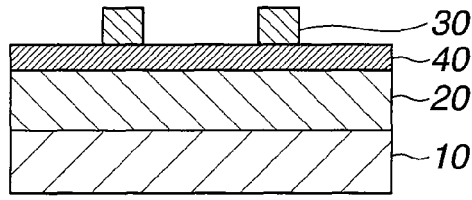
FIG. 1B shows the first resist film being exposed and developed.
Figure 1C:
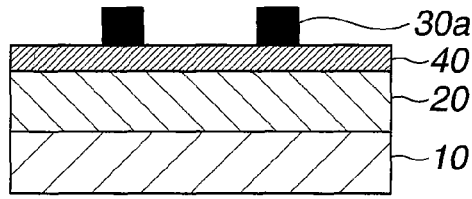
FIG. 1C shows the first resist film being modified for inactivation.

The singular forms "a," "an" and "the" include plural referents unless the context clearly dictates otherwise.

"Optional" or "optionally" means that the subsequently described event or circumstance may or may not occur, and that the description includes instances where the event occurs and instances where it does not.

As used herein, the notation ($C_n$—$C_m$) means a group containing from n to m carbon atoms per group.

As used herein, the term "film" is used interchangeably with "coating" or "layer." The term "processable layer" is interchangeable with patternable layer and refers to a target layer that can be processed such as by etching to form a pattern therein.

The abbreviations and acronyms have the following meaning.
Mw: weight average molecular weight
Mn: number average molecular weight
Mw/Mn: molecular weight distribution or dispersity
GPC: gel permeation chromatography
PEB: post-exposure baking
TMAH: tetramethylammonium hydroxide
PGMEA: propylene glycol monomethyl ether acetate In connection with the double patterning lithography involving double exposures and developments to form a substantially half-pitch pattern, the inventors made efforts to develop a resist-modifying composition which enables to process a substrate by a single dry etching and a patterning process using the same.

The inventors have discovered that a double patterning process can be practiced by coating a first positive resist composition comprising a copolymer comprising recurring units having lactone as an adhesive group and recurring units having an acid labile group, effecting first exposure and development to form a first resist line pattern, treating the first resist pattern with a resist-modifying composition comprising a base resin, a nitrogen-containing compound, and a solvent for inactivating the first resist pattern to a second resist process and endowing it with an adequate contact angle with pure water, then implementing the second resist process to form a second resist pattern composed mainly of lines parallel to the first resist line pattern, for thereby reducing the distance between pattern lines while preventing pattern collapse and minimizing development defects. Then the substrate can be processed by a single dry etching. The present invention is predicated on this discovery.

Prior art methods for insolubilizing the first resist pattern using a solution of a base resin as an insolubilizing agent suffer from problems of fine line pattern collapse and development defects. Pattern collapse occurs because a water-soluble resin or a highly polar resin containing a considerable amount of amide or similar groups is used as the base resin. The base resin is attached to or mixed with the first pattern surface and the substrate surface after modification treatment to render the surfaces hydrophilic whereby the contact angle with pure water of the surface is significantly reduced. As a result, the first pattern undergoes increased stresses during alkaline water development and water rinsing in the second line pattern forming process. Pattern collapse occurs in this way. In the double patterning process for forming a line pattern at a narrow pitch, the distance between final resist pattern features is close as compared with the ordinary single patterning process, presenting harsh conditions under which the pattern collapse problem becomes more outstanding. With regard to the ordinary patterning process rather than double patterning, JP-B H06-105683 and JP-A H07-142349 describe that the contact angle of the resist surface with rinse liquid is correlated to the pattern collapse.

Inversely, where the first pattern surface and the substrate surface after modification treatment have a high contact angle with pure water and are extremely hydrophobic, foreign matter may form on the first resist pattern and the substrate surface after formation of a second pattern. It is pointed out in JP-A 2008-152130 that more defects known as blobs form when the resist surface is more hydrophobic. As to development defects, when a high polarity polymer containing nitrogen or the like is deposited on the substrate surface, the acid generated by the photoacid generator upon exposure of a second pattern is deactivated near the substrate. This inhibits deprotection reaction of the resist base resin, resulting in insufficient release of acidic groups. Then even in the exposed area, some resist is left undissolved in developer, becoming development defects.

The pattern forming process of the invention overcomes these problems by modification treatment for tailoring the contact angle with pure water of the first pattern surface and the substrate surface so as to fall within an optimum range. The resist film in the unexposed area after modification treatment should have a contact angle with pure water of 50 to 85 degrees, preferably 55 to 75 degrees. A change of contact angle with pure water of the resist film in the unexposed area before and after modification treatment should preferably be not more than 10 degrees. The substrate after modification treatment should preferably have a contact angle with pure water of 45 to 85 degrees, more preferably 50 to 75 degrees.

In the pattern forming process of the invention, a resist-modifying composition comprising a base resin, a nitrogen-containing organic compound, and a solvent is preferably used. The solvent used in the resist-modifying composition should have the nature that it does not substantially dissolve the first resist pattern and is preferably selected from alcohols of 3 to 8 carbon atoms, ethers of 6 to 12 carbon atoms, alkanes of 6 to 16 carbon atoms, alkenes and aromatic hydrocarbons. Mixtures of two or more of these organic solvents or mixtures of an organic solvent with water may also be used.

Suitable alcohols of 3 to 8 carbon atoms include n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2,2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol. Suitable ethers of 6 to 12 carbon atoms include methyl cyclopentyl ether, methyl cyclohexyl ether, anisole, diisopropyl ether, diisobutyl ether, diisopentyl ether, di-n-pentyl ether, methyl cyclopentyl ether, methyl cyclohexyl ether, di-n-butyl ether, di-sec-butyl ether, diisopentyl ether, di-sec-pentyl ether, di-tert-amyl ether, and di-n-hexyl ether. Suitable alkanes of 6 to 16 carbon atoms include hexane, octane, decane, cyclohexane, cycloheptane, cyclooctane, cyclodecane, methylcyclohexane, dimethylcyclohexane, methyladamantane, dimethyladamantane, decahydronaphthalene. Suitable aromatic hydrocarbons include benzene, toluene and xylene. Of these, preferred are isobutyl alcohol, 2-methyl-1-butanol, 3-methyl-1-butanol, butanol, and solvent mixtures based on any of the foregoing. The solvent may be used in an amount of 1,000 to 20,000 parts, and preferably 2,000 to 10,000 parts by weight per 100 parts by weight of the base resin.

As used in the pattern forming process, the resist-modifying composition is preferably one comprising a base resin which is soluble in alkaline developer and non-soluble in water, the base resin having a fluorine atom content of 15 to 55% by weight, a nitrogen-containing organic compound, and a solvent. Since it is preferable in practice that after resist modifying treatment, the excess base resin be strippable with developer, the base resin is desired to be soluble in alkaline developer. On the other hand, since a highly hydrophilic base resin has a more likelihood of pattern collapse and development defects as discussed above, the base resin is desired to be non-soluble in water. In addition, the base resin should be soluble in the above-mentioned solvent. To meet these requirements, the base resin should desirably comprise recurring units having the general formula (1) or (2), shown below. Incorporation of recurring units of formula (1) or (2) may endow the base resin with appropriate acidity, hydrophobicity, and organic solvent solubility. Recurring units of formula (1) or (2) may be of one type or more than one type, and they may be incorporated preferably in a total proportion of 20 to 100 mol %, more preferably 35 to 100 mol %.

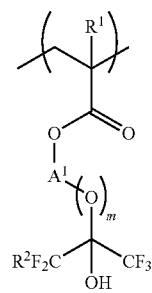

(1)

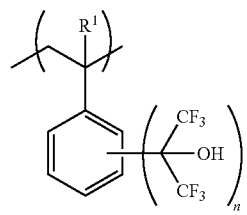

(2)

Herein $A^1$ is a straight, branched or cyclic $C_1$-$C_{15}$ alkylene or alkylidene group which may contain fluorine or hydroxyl or both, $R^1$ is hydrogen or methyl, $R^2$ is hydrogen or fluorine, or $R^2$ may be a single bond to $A^1$ wherein the moiety $A^1$-$(O)_m$—C—CF$_2$ is an alicyclic or ether ring, m is equal to 0 or 1, and n is equal to 1 or 2.

When $A^1$ stands for a straight, branched or cyclic $C_1$-$C_{15}$ alkylene or alkylidene group which may contain fluorine and/or hydroxyl, examples of $A^1$ include methylene, ethylene, propylene, butylene, trimethylene, tetramethylene, pentamethylene, pentadecamethylene, 1,2-cyclopentylene, 1,3-cyclopentylene, 1,2-cyclohexylene, 1,3-cyclohexylene, 1,4-cyclohexylene, norbornanediyl, ethylidene, propylidene, isopropylidene, butylidene, decylidene, pentadecylidene, cyclopentylidene, cyclohexylidene, cyclopentylmethylene, cyclohexylmethylene, and 5-[2,2,2-trifluoro-1-hydroxy-1-(trifluoromethyl)ethyl]-1,3-cyclohexylene. When $A^1$ bonds with $R^2$ to form an alicyclic or ether ring, examples of $A^1$ include 1,2,2-propanetriyl, 1,2,4-cyclopentanetriyl, and 1,1,2-cyclohexanetriyl. $R^1$ is hydrogen or methyl, and preferably methyl. $R^2$ may be hydrogen or fluorine, or bond as a single bond to $A^1$ to form an alicyclic or ether ring. Preferably $R^2$ is fluorine or a single bond. The subscript m is equal to 0 or 1.

Preferred recurring units of formula (1) include, but are not limited to, those recurring units derived from the monomers shown below. In the formulae, $R^1$ is hydrogen or methyl.

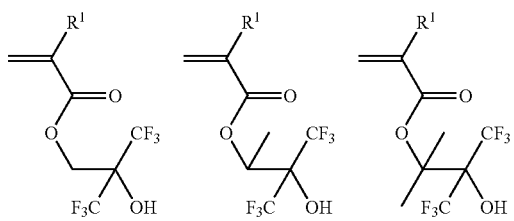

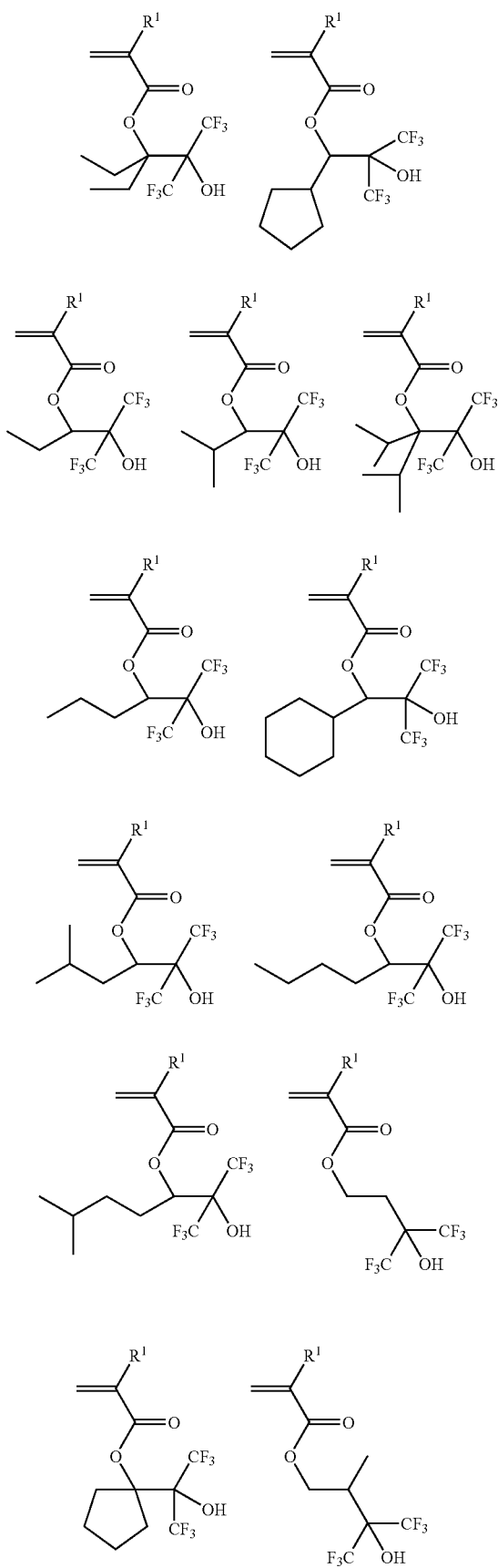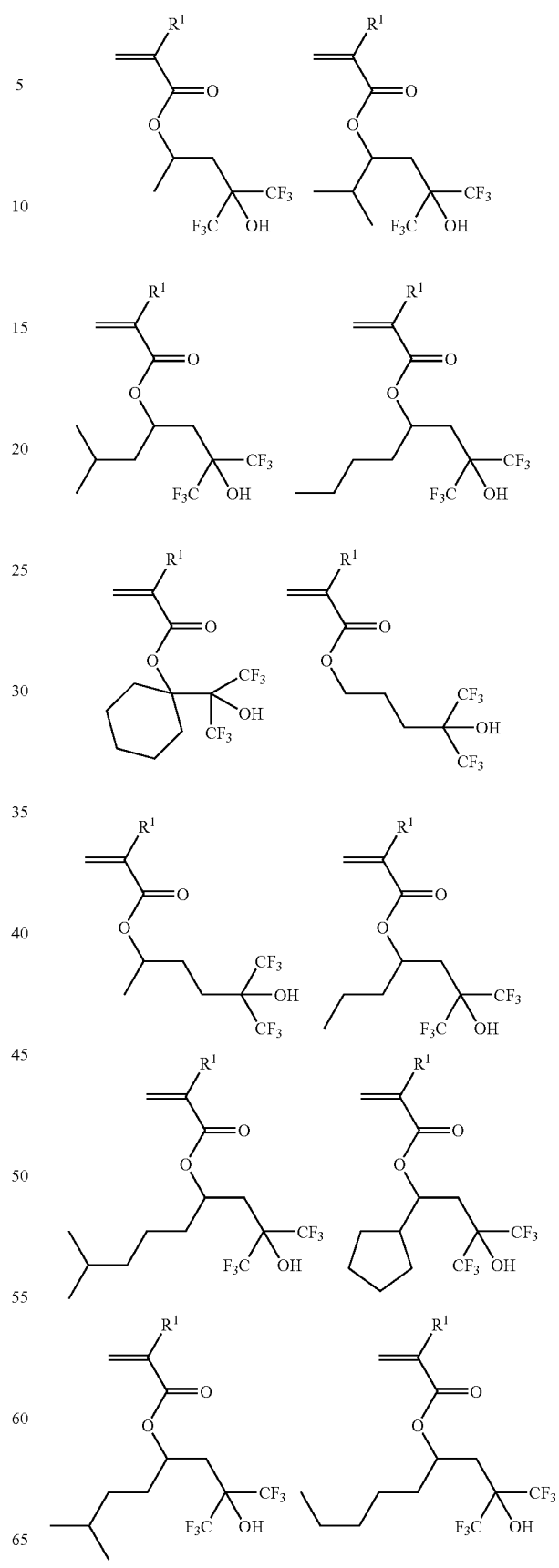

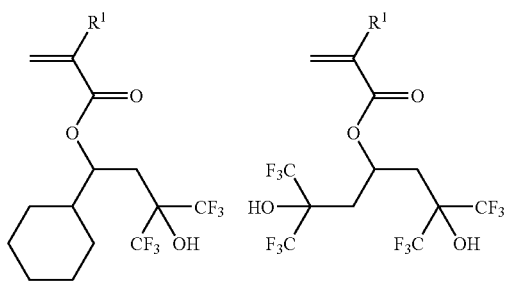
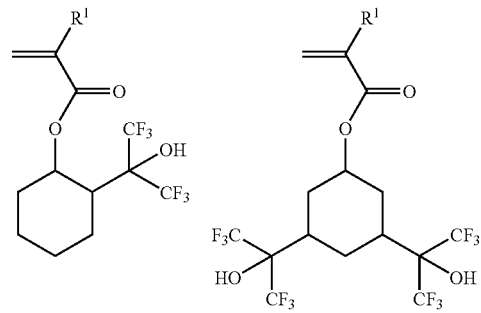
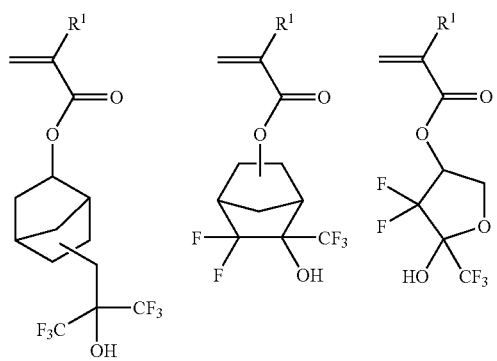
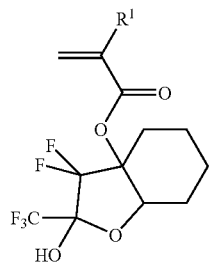

In formula (2), n is 1 or 2. Preferred recurring units of formula (2) include, but are not limited to, those recurring units derived from the monomers shown below. In the formulae, $R^1$ is hydrogen or methyl.

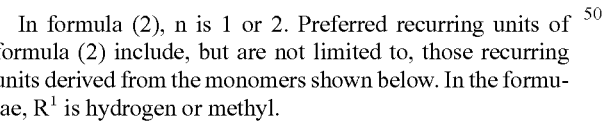
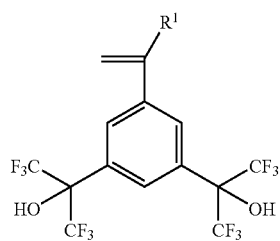

In a preferred embodiment, the base resin in the resist-modifying composition comprises recurring units having the general formula (1) or (2) and nitrogen-containing recurring units in an amount of up to 40 mol %, more preferably up to 35 mol %, and even more preferably up to 30 mol %, based on the entire recurring units. A resist-modifying composition comprising a base resin containing a higher proportion of nitrogen-containing recurring units has a more likelihood of development defects as discussed above.

Examples of suitable nitrogen-containing recurring units are given below, but not limited thereto. In the formulae, $R^1$ is hydrogen or methyl.

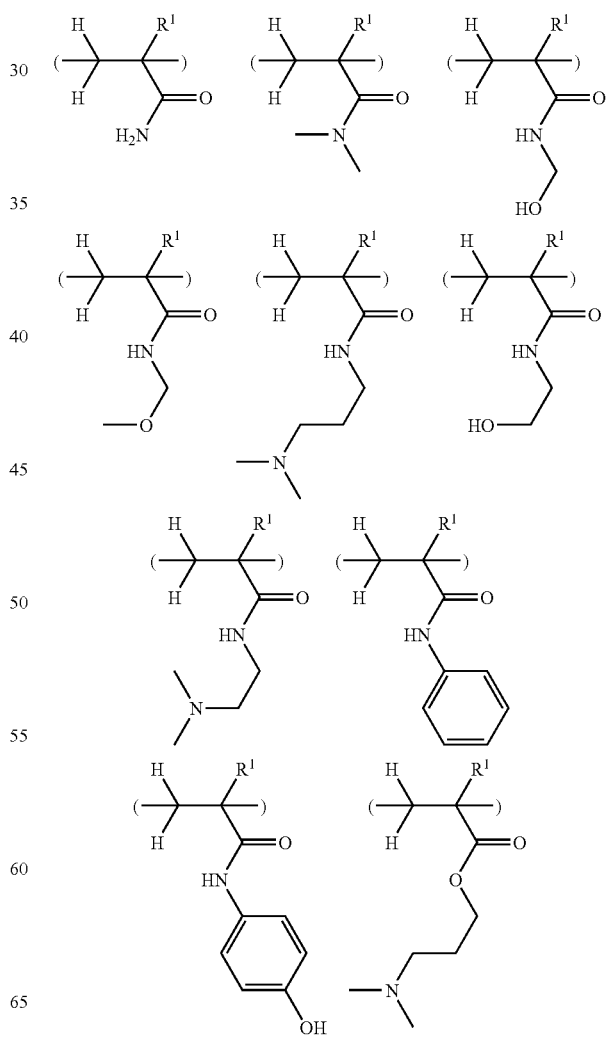

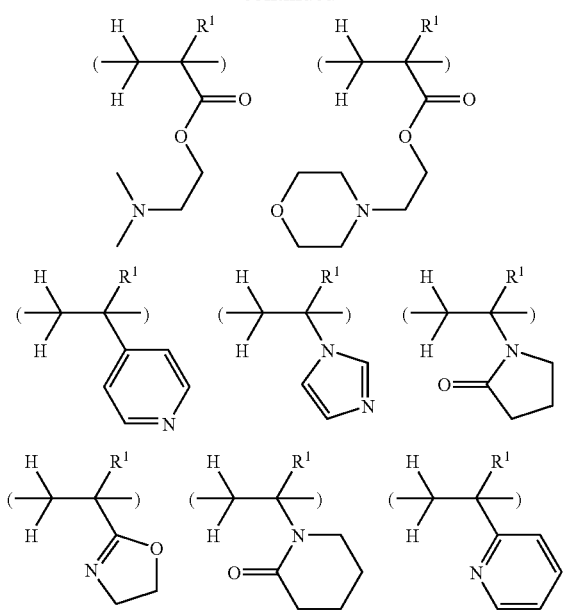

In another preferred embodiment, the base resin in the resist-modifying composition may comprise hydroxyl-containing recurring units as well as recurring units having the general formula (1) or (2). Preferred hydroxyl-containing recurring units include, but are not limited to, those recurring units derived from the monomers shown below. In the formulae, $R^1$ is hydrogen or methyl.

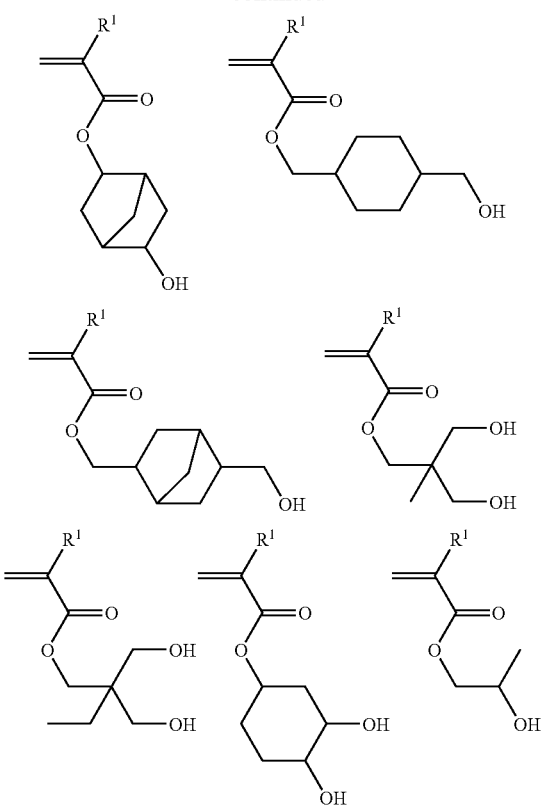

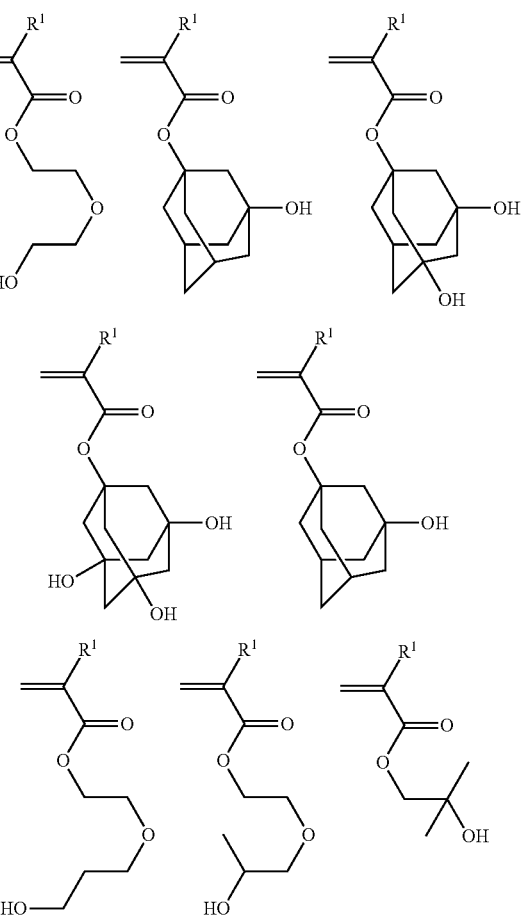

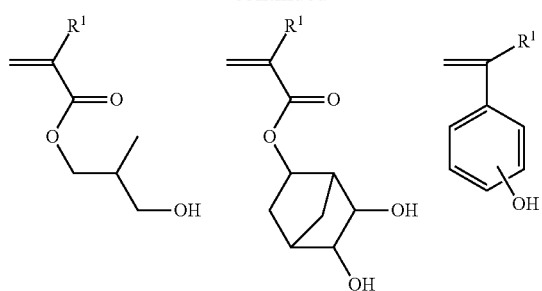
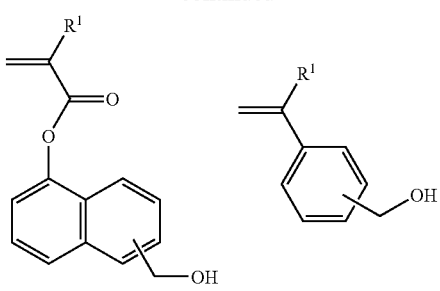
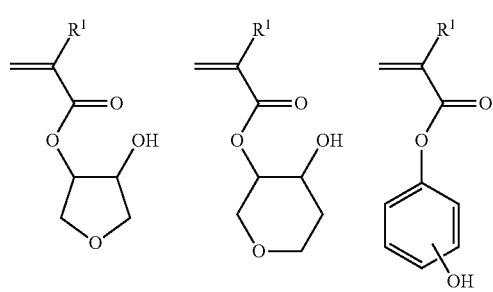
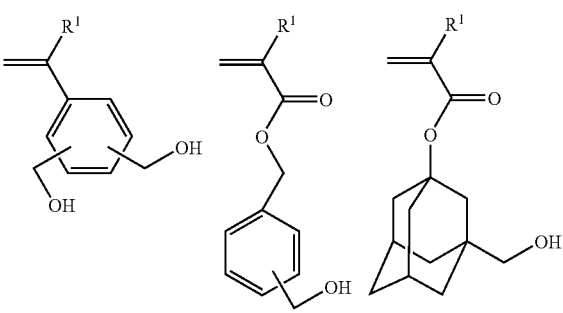
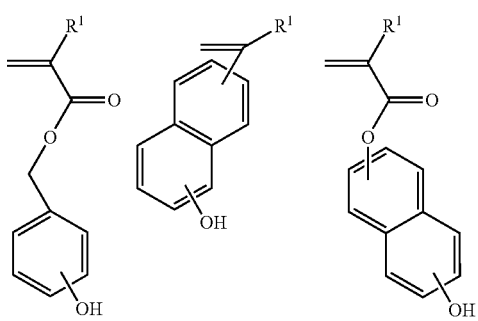
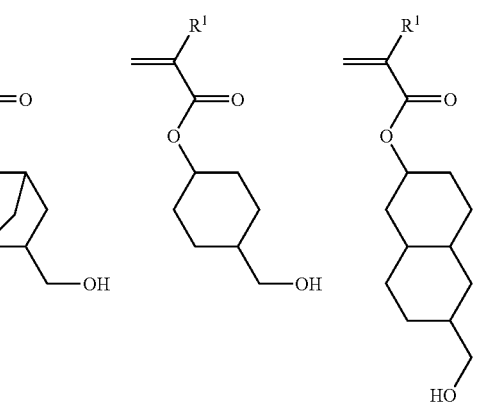
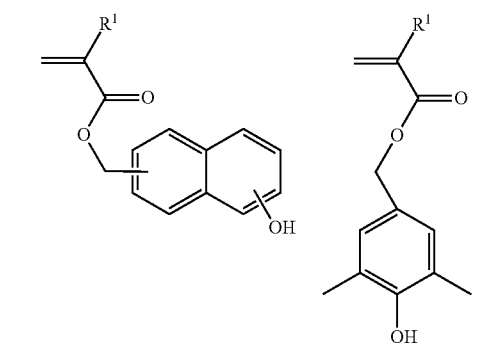
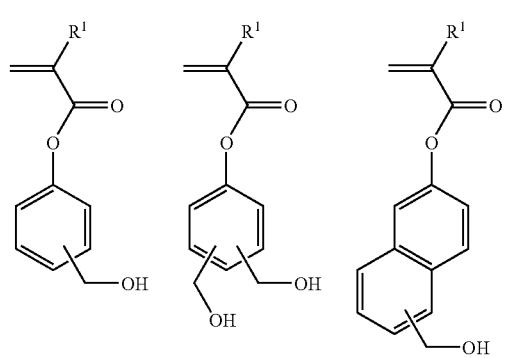
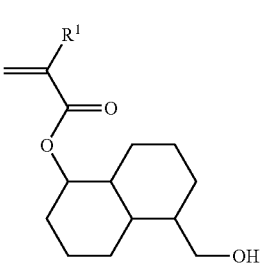

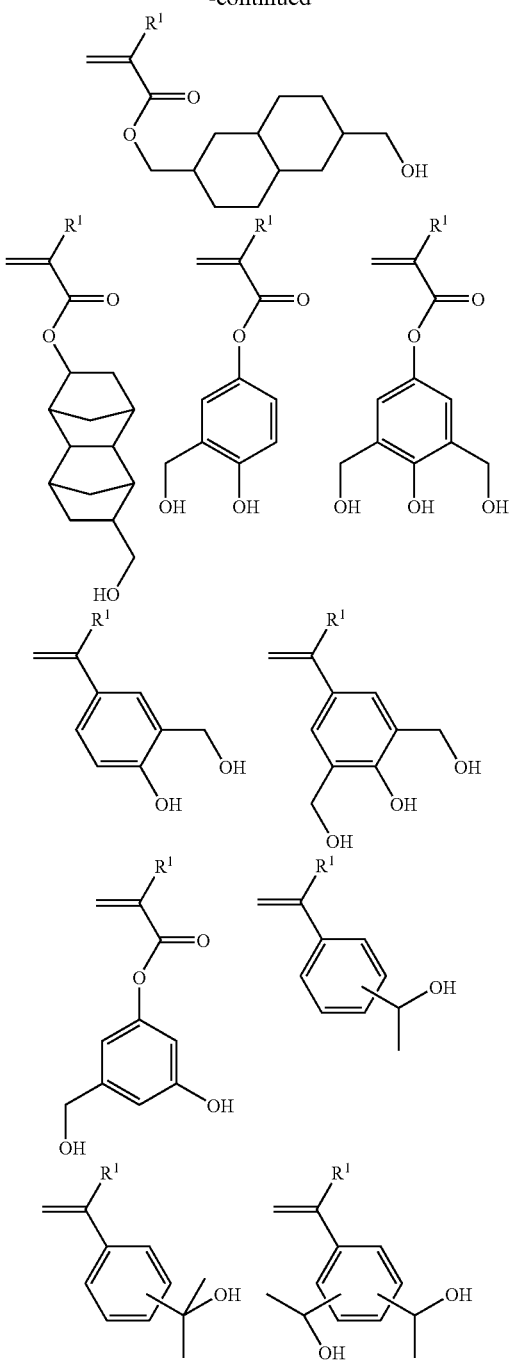

The hydroxyl-containing recurring units are effective for improving the solubility in alcohol solvents of the base resin comprising the same, and may participate in crosslinking reaction and facilitate inactivation of the first resist pattern. The hydroxyl-containing recurring units other than the recurring units of formula (1) or (2) may be incorporated preferably in an amount of 0 to 50 mol %, more preferably 0 to 40 mol % based on the entire recurring units. When incorporated, an amount of hydroxyl-containing recurring units is preferably at least 5 mol %.

In addition to the hydroxyl-containing recurring units, the base resin in the resist-modifying composition may further comprise crosslinkable recurring units having an epoxy or oxetanyl group. Incorporation of recurring units having an epoxy or oxetanyl group endows the base resin and hence, the resist-modifying composition with high crosslinking reaction capability to facilitate inactivation of the first resist pattern. The recurring units having an epoxy or oxetanyl group may be incorporated preferably in an amount of 0 to 70 mol %, more preferably 0 to 60 mol % based on the entire recurring units. When incorporated, an amount of recurring units having an epoxy or oxetanyl group is preferably at least 5 mol %. Examples of suitable recurring units having an epoxy or oxetanyl group include, but are not limited to, those recurring units derived from the monomers shown below. In the formulae, $R^1$ is hydrogen or methyl.

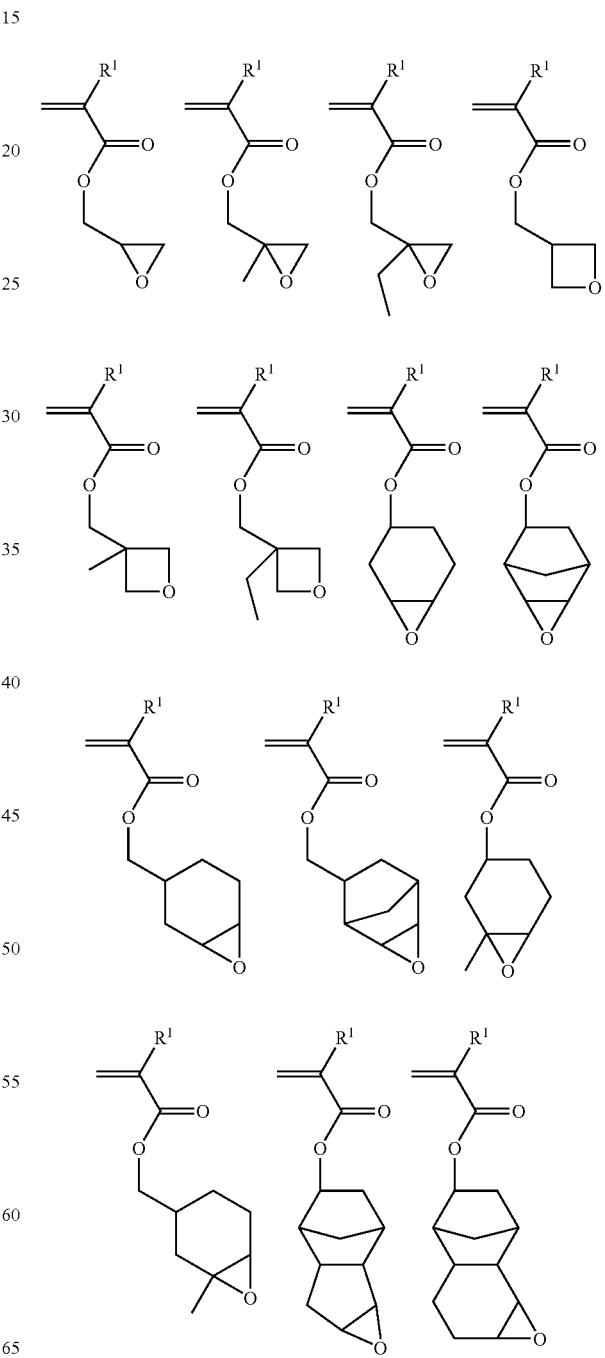

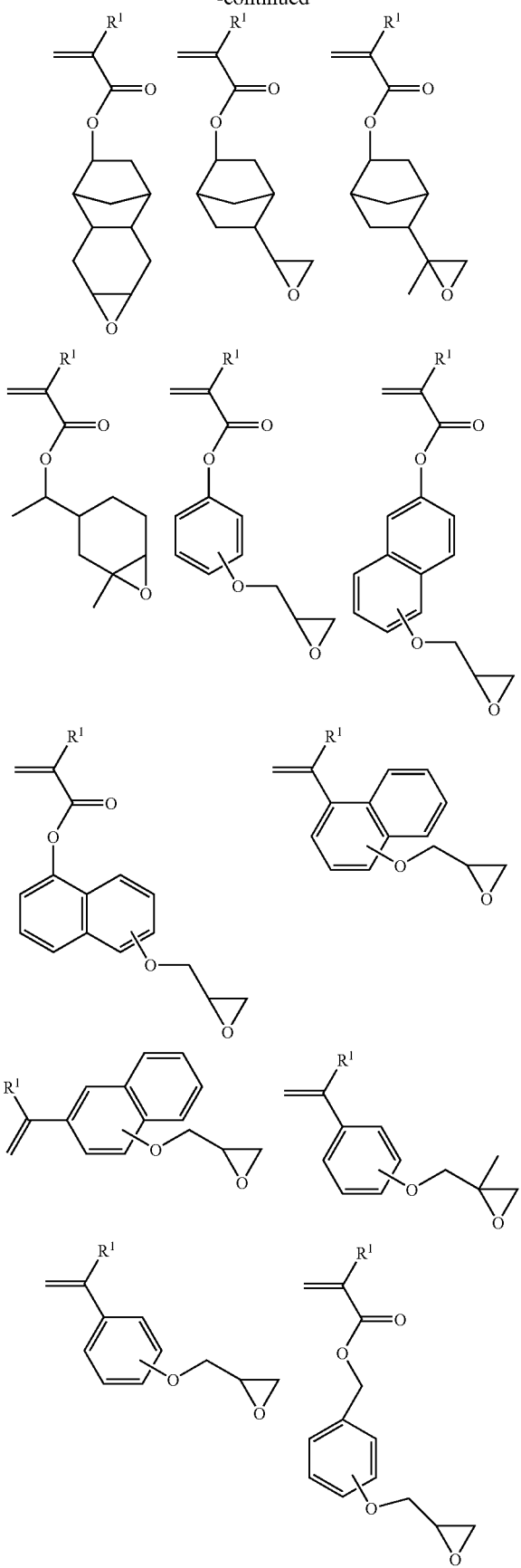

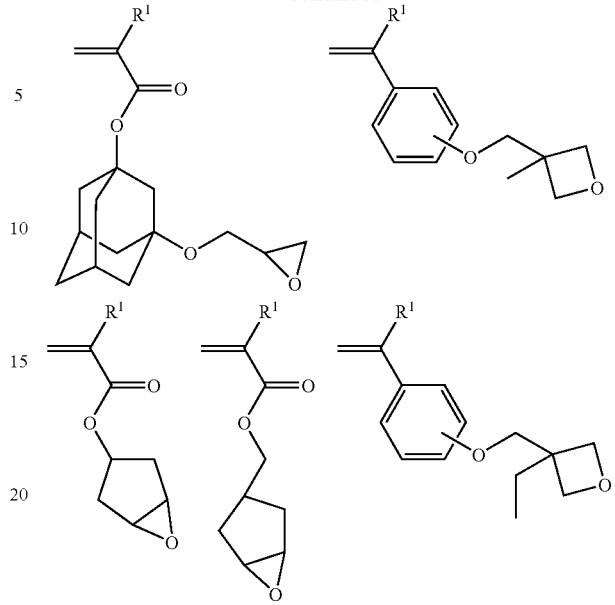

Many examples of the monomers from which recurring units having an epoxy or oxetanyl group are derived are disclosed in JP-A 2003-55362, JP-A 2005-8847, and JP-A 2005-18012.

The base resin preferably has a weight average molecular weight (Mw) of 2,000 to 100,000, and more preferably 3,000 to 50,000 as measured by GPC versus polystyrene standards.

One preferred embodiment of the pattern forming process of the invention uses a resist-modifying composition comprising a base resin comprising recurring units of formula (1) or (2) and a nitrogen-containing organic compound. Upon patternwise exposure of the second resist film to radiation, the first resist pattern is also exposed to radiation. Even in a situation where the first resist pattern is not dissolved in the second resist composition and intermixing with the first resist pattern or dissolution of the first resist pattern during coating of the second resist composition is prevented, the acid generated in the first resist pattern upon exposure of the second resist film acts to promote deprotection reaction in the first resist pattern, resulting in the first resist pattern being dissolved away after development of the second resist film. If a nitrogen-containing organic compound is present in the first resist pattern and in excess relative to the acid generated upon second exposure, then it neutralizes the acid generated upon exposure of the second resist film, restraining deprotection reaction in the first resist pattern and eventually preventing the first resist pattern from being dissolved away during development of the second resist film. Usually, a quencher in the form of a nitrogen-containing organic compound is added to photoresist material for the purposes of increasing contrast and suppressing acid diffusion, but in a smaller amount than the acid generator. In order that amine be available in a larger amount than the amount of the acid generated by the acid generator in the first resist pattern upon second exposure, it is contemplated to supply a nitrogen-containing organic compound after the first resist pattern is formed by development.

In the resist-modifying composition, the nitrogen-containing organic compound is preferably blended in an amount of 5 to 200 parts and more preferably 10 to 100 parts by weight per 100 parts by weight of the base resin.

Examples of the nitrogen-containing organic compound which can be used herein include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amides, imides, and carbamates. The preferred amines for inactivating acid are high basicity compounds. Since a dissociation constant (pKa) is often used as an index of basicity, the preferred compounds have a pKa value of at least 7, more preferably at least 8.

In a more preferred embodiment of the pattern forming process, the resist-modifying composition comprises a base resin comprising recurring units having the general formula (1) or (2) and an aminosilane compound as the nitrogen-containing organic compound. Specifically the nitrogen-containing organic compound is an aminosilane compound having the general formula (3) shown below. The aminosilane compound of formula (3) contributes to inactivation in that in addition to the neutralization effect of the generated acid described above, it adsorbs to or mixes with the surface of the first resist pattern upon coating of the modifying composition, and forms siloxane bonds by itself upon heating or the like, to form crosslinks, thereby modifying the first resist pattern surface to improve its solvent resistance.

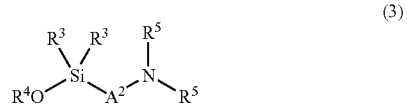

(3)

Herein $A^2$ is a straight, branched or cyclic $C_2$-$C_{20}$ alkylene group, $C_6$-$C_{15}$ arylene group or $C_7$-$C_{16}$ aralkylene group which may contain a hydroxyl, ether or amino group. $R^3$ is each independently $C_1$-$C_4$ alkyl or $OR^4$, wherein $R^4$ is hydrogen or $C_1$-$C_6$ alkyl. $R^5$ is each independently hydrogen, or a $C_1$-$C_4$ alkyl group which may contain a hydroxyl or ether group, or two $R^5$ may bond together to form a ring with the nitrogen atom to which they are attached.

In formula (3), $A^2$ is a straight, branched or cyclic $C_2$-$C_{20}$ alkylene, $C_6$-$C_{15}$ arylene or $C_7$-$C_{16}$ aralkylene group optionally containing a hydroxyl, ether or amino group, examples of which include ethylene, propylene, butylene, trimethylene, tetramethylene, pentamethylene, undecamethylene, pentadecamethylene, eicosamethylene, 1,2-cyclopentylene, 1,3-cyclopentylene, 1,2-cyclohexylene, 1,3-cyclohexylene, 1,4-cyclohexylene, norbornanediyl, 2,3'-iminoethylpropyl, 4-azaundecane-1,1'-diyl, 4,7-diazanonane-1,9-diyl, 2-methylpropane-1,3-diyl, 7-azaoctadecane-1,18-diyl, 1,4-phenylene, 1,3-phenylene, trimethyleneoxyphenyl, 1,2-xylylene, 1,3-xylylene, 1,4-xylylene, 2-hydroxypropane-1,3-diyl, and 3-oxapentane-1,5-diyl. $R^3$ is each independently $C_1$-$C_4$ alkyl or $OR^4$, examples of which include methyl, ethyl, propyl, isopropyl, butyl, s-butyl, t-butyl, isobutyl and $OR^4$. $R^4$ is hydrogen or $C_1$-$C_6$ alkyl, for example, hydrogen, methyl, ethyl, propyl, isopropyl, butyl, s-butyl, t-butyl, isobutyl, amyl, isoamyl, hexyl, cyclopentyl or cyclohexyl. When $R^5$ is each independently hydrogen, or a $C_1$-$C_4$ alkyl group which may contain a hydroxyl or ether group, examples include hydrogen, methyl, ethyl, propyl, isopropyl, butyl, s-butyl, t-butyl, isobutyl, 2-hydroxyethyl, and 2-methoxyethyl. When two $R^5$ bond together to form a ring, exemplary rings include pyrrolidine, piperidine, piperazine, N-methylpiperazine, and morpholine.

Illustrative non-limiting examples of the aminosilane compound having formula (3) include 3-aminopropyltrimethoxysilane, 3-aminopropyltriethoxysilane, 3-aminopropyltripropoxysilane, 3-aminopropyltriisopropoxysilane, 3-aminopropyltrihydroxysilane, 2-aminoethylaminomethyltrimethoxysilane, 2-aminoethylaminomethyltriethoxysilane, 2-aminoethylaminomethyltripropoxysilane, 2-aminoethylaminomethyltrihydroxysilane, isopropylaminomethyltrimethoxysilane, 2-(2-aminoethylthio)ethyltrimethoxysilane, allyloxy-2-aminoethylaminomethyldimethylsilane, butylaminomethyltrimethoxysilane, 3-aminopropyldiethoxymethylsilane, 3-(2-aminoethylamino)propyldimethoxymethylsilane, 3-(2-aminoethylamino)propyltrimethoxysilane, 3-(2-aminoethylamino)propyltriethoxysilane, 3-(2-aminoethylamino)propyltriisopropoxysilane, piperidinomethyltrimethoxysilane, 3-(allylamino)propyltrimethoxysilane, 4-methylpiperazinomethyltrimethoxysilane, 2-(2-aminoethylthio)ethyldiethoxymethylsilane, morpholinomethyltrimethoxysilane, 4-acetylpiperazinomethyltrimethoxysilane, cyclohexylaminotrimethoxysilane, 2-piperidinoethyltrimethoxysilane, 2-morpholinoethylthiomethyltrimethoxysilane, dimethoxymethyl-2-piperidinoethylsilane, 3-morpholinopropyltrimethoxysilane, dimethoxymethyl-3-piperazinopropylsilane, 3-piperazinopropyltrimethoxysilane, 3-butylaminopropyltrimethoxysilane, 3-dimethylaminopropyldiethoxymethylsilane, 2-(2-aminoethylthio)ethyltriethoxysilane, 3-[2-(2-aminoethylamino)ethylamino]propyltrimethoxysilane, 3-phenylaminopropyltrimethoxysilane, 2-aminoethylaminomethylbenzyloxydimethylsilane, 3-(4-acetylpiperazinopropyl)trimethoxysilane, 3-(3-methylpiperidinopropyl)trimethoxysilane, 3-(4-methylpiperidinopropyl)trimethoxysilane, 3-(2-methylpiperidinopropyl)trimethoxysilane, 3-(2-morpholinoethylthiopropyl)trimethoxysilane, dimethoxymethyl-3-(4-methylpiperidinopropyl)silane, 3-cyclohexylaminopropyltrimethoxysilane, 3-benzylaminopropyltrimethoxysilane, 3-(2-piperidinoethylthiopropyl)trimethoxysilane, 3-hexamethyleneiminopropyltrimethoxysilane, 3-pyrrolidinopropyltrimethoxysilane, 3-(6-aminohexylamino)propyltrimethoxysilane, 3-(methylamino)propyltrimethoxysilane, 3-(ethylamino)-2-methylpropyltrimethoxysilane, 3-(butylamino)propyltrimethoxysilane, 3-(t-butylamino)propyltrimethoxysilane, 3-(diethylamino)propyltrimethoxysilane, 3-(cyclohexylamino)propyltrimethoxysilane, 3-anilinopropyltrimethoxysilane, 4-aminobutyltrimethoxysilane, 11-aminoundecyltrimethoxysilane, 11-aminoundecyltriethoxysilane, 11-(2-aminoethylamino)undecyltrimethoxysilane, p-aminophenyltrimethoxysilane, m-aminophenyltrimethoxysilane, 3-(m-aminophenoxy)propyltrimethoxysilane, 2-(2-pyridyl)ethyltrimethoxysilane, 2-[(2-aminoethylamino)methylphenyl]ethyltrimethoxysilane, diethylaminomethyltriethoxysilane, 3-[(3-acryloyloxy-2-hydroxypropyl)amino]propyltriethoxysilane, 3-(ethylamino)-2-methylpropyl(methyldiethoxysilane), and 3-[bis(hydroxyethyl)amino]propyltriethoxysilane.

The aminosilane compounds of formula (3) may be used alone or in admixture of two or more. They may also be used in the form of (partially) hydrolyzed condensates.

Suitable aminosilane compounds of formula (3) further include reaction products of an oxirane-containing silane compound with an amine compound, as represented by the general formula (S1).

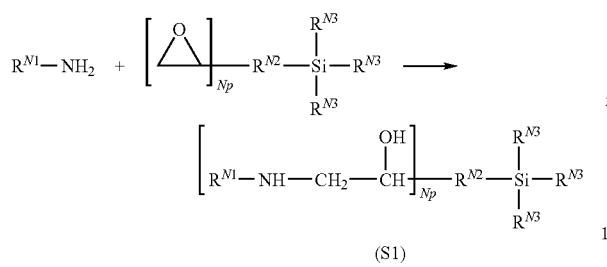

(S1)

Herein $R^{N1}$ is hydrogen, or a straight, branched or cyclic $C_1$-$C_{20}$ alkyl, $C_6$-$C_{10}$ aryl or $C_2$-$C_{12}$ alkenyl group which may have a hydroxyl, ether, ester or amino group. The subscript Np is 1 or 2. When Np is 1, $R^{N2}$ is a straight, branched or cyclic $C_1$-$C_{20}$ alkylene group which may have an ether, ester or phenylene group. When Np is 2, $R^{N2}$ is the alkylene group with one hydrogen atom being eliminated. $R^{N3}$ is each independently hydrogen, or a $C_1$-$C_6$ alkyl, $C_6$-$C_{10}$ aryl, $C_2$-$C_{12}$ alkenyl, $C_1$-$C_6$ alkoxy, $C_6$-$C_{10}$ aryloxy, $C_2$-$C_{12}$ alkenyloxy, $C_7$-$C_{12}$ aralkyloxy or hydroxyl group, at least one of $R^{N3}$ being alkoxy or hydroxyl.

Desired among the amine compounds are primary and secondary amine compounds. Suitable primary amine compounds include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine, ethanolamine, N-hydroxyethylethylamine, and N-hydroxypropylethylamine. Suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

The aminosilane compound may be blended with another silane compound. Blends of aminosilanes and oxirane-containing silanes are described in, for example, JP-A 2005-248169. When an aminosilane of formula (3) wherein one $R^5$ is hydrogen (i.e., aminosilane having a secondary amino group) or wherein two $R^5$ are hydrogen atoms (i.e., aminosilane having a primary amino group) is mixed with an oxirane-containing silane, a silane compound having the general formula (S2) forms according to the following reaction scheme and adsorbs to the resist surface.

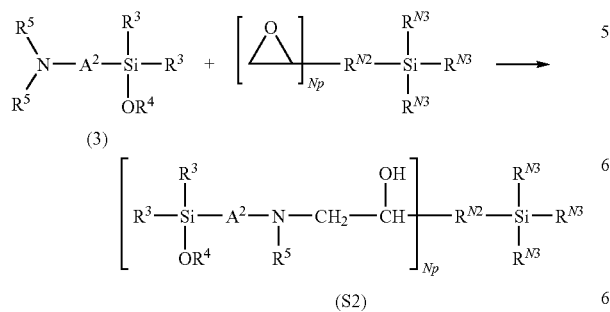

(S2)

Herein $A^2$, $R^3$, $R^4$, $R^{N2}$, $R^{N3}$, and Np are as defined above.

An oxetane-containing silane compound may be used instead of the oxirane-containing silane compound. Examples of suitable oxirane and oxetane-containing silane compounds used herein are shown below.

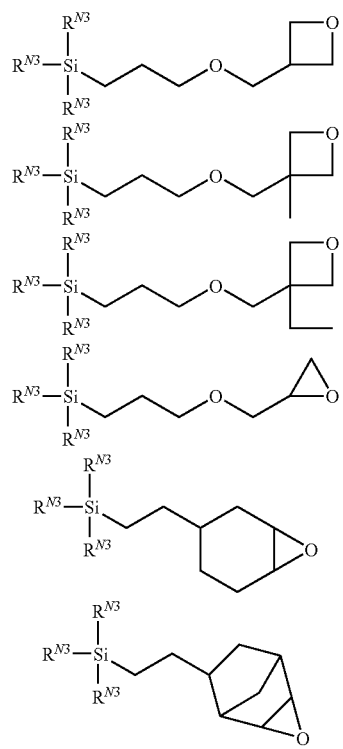

Herein $R^{N3}$ is as defined above.

In a further preferred embodiment of the pattern forming process, the resist-modifying composition comprises a base resin comprising recurring units having the general formula (1) or (2) and a non-silicon crosslinker as the nitrogen-containing organic compound. Like the aminosilane compound, the non-silicon nitrogen-containing crosslinker contributes to inactivation in that in addition to the neutralization effect of the generated acid, it adsorbs to or mixes with the first resist pattern during the modifying treatment and forms crosslinks with the first resist pattern and/or the base resin of the resist-modifying composition or by itself upon heating, thereby modifying the first resist pattern to improve its solvent resistance.

The non-silicon nitrogen-containing crosslinker used herein is not particularly limited and may be selected from a wide variety of well-known non-silicon nitrogen-containing crosslinkers. Suitable crosslinkers include melamine, glycoluril, benzoguanamine, urea, β-hydroxyalkylamide, isocyanurate, aziridine, oxazoline and amine crosslinkers.

Suitable melamine crosslinkers include hexamethoxymethylated melamine, hexabutoxymethylated melamine, and alkoxy and/or hydroxy-substituted derivatives thereof, and partial self-condensates thereof. Suitable glycoluril crosslinkers include tetramethoxymethylated glycoluril, tetrabutoxymethylated glycoluril, and alkoxy and/or hydroxy-substituted derivatives thereof, and partial self-condensates thereof. Suitable benzoguanamine crosslinkers include tetramethoxymethylated benzoguanamine, tetrabutoxymethylated benzoguanamine, and alkoxy and/or hydroxy-substituted derivatives thereof, and partial self-condensates thereof. Suitable urea crosslinkers include dimethoxymethylated dimethoxyethyleneurea, and alkoxy and/or hydroxy-substituted derivatives thereof, and partial self-condensates thereof. A typical β-hydroxyalkylamide crosslinker is N,N,N',N'-tetra (2-hydroxyethyl)adipic acid amide. Suitable isocyanurate crosslinkers include triglycidyl isocyanurate and triallyl isocyanurate. Suitable aziridine crosslinkers include 4,4'-bis (ethyleneiminocarbonylamino)diphenylmethane and 2,2-bishydroxymethylbutanol-tris[3-(1-aziridinyl)propionate]. Suitable oxazoline crosslinkers include 2,2'-isopropylidenebis(4-benzyl-2-oxazoline), 2,2'-isopropylidenebis(4-phenyl-2-oxazoline), 2,2'-isopropylidenebis(4-phenyl-2-oxazoline), 2,2'-methylenebis(4,5-diphenyl-2-oxazoline), 2,2'-methylenebis(4-phenyl-2-oxazoline), 2,2'-methylenebis(4-tert-butyl-2-oxazoline), 2,2'-bis(2-oxazoline), 1,3-phenylenebis(2-oxazoline), 1,4-phenylenebis(2-oxazoline), and 2-isopropenyloxazoline copolymers.

Suitable amine crosslinkers include compounds having a plurality of amino groups such as ethylenediamines. Examples of ethylenediamines include, but are not limited to, ethylenediamine, 1,2-diaminopropane, 1,2-diamino-2-methylpropane, N-methylethylenediamine, N-ethylethylenediamine, N-isopropylethylenediamine, N-hexylethylenediamine, N-cyclohexylethylenediamine, N-octylethylenediamine, N-decylethylenediamine, N-dodecylethylenediamine, N,N-dimethylethylenediamine, N,N-dimethylethylenediamine, N,N-diethylethylenediamine, N,N'-diethylethylenediamine, N,N'-diisopropylethylenediamine, N,N,N'-trimethylethylenediamine, diethylenetriamine, N-isopropyldiethylenetriamine, N-(2-aminoethyl)-1,3-propanediamine, triethylenetetramine, N,N'-bis(3-aminopropyl)ethylenediamine, N,N'-bis(2-aminoethyl)-1,3-propanediamine, tris(2-aminoethyl)amine, tetraethylenepentamine, pentaethylenehexamine, 2-(2-aminoethylamino)ethanol, N,N'-bis(hydroxyethyl)ethylenediamine, N-(hydroxyethyl)diethylenetriamine, N-(hydroxyethyl)triethylenetetramine, piperazine, 1-(2-aminoethyl)piperazine, 4-(2-aminoethyl)morpholine, and polyethyleneimine. Diamines other than the ethylenediamines and polyamines are also useful. Exemplary other diamines and polyamines include, but are not limited to, 1,3-diaminopropane, 1,4-diaminobutane, 1,3-diaminopentane, 1,5-diaminopentane, 2,2-dimethyl-1,3-propanediamine, hexamethylenediamine, 2-methyl-1,5-diaminopropane, 1,7-diaminoheptane, 1,8-diaminooctane, 2,2,4-trimethyl-1,6-hexanediamine, 2,4,4-trimethyl-1,6-hexanediamine, 1,9-diaminononane, 1,10-diaminodecane, 1,12-diaminododecane, N-methyl-1,3-propanediamine, N-ethyl-1,3-propanediamine, N-isopropyl-1,3-propanediamine, N,N-dimethyl-1,3-propanediamine, N,N'-dimethyl-1,3-propanediamine, N,N'-diethyl-1,3-propanediamine, N,N'-diisopropyl-1,3-propanediamine, N,N,N'-trimethyl-1,3-propanediamine, 2-butyl-2-ethyl-1,5-pentanediamine, N,N'-dimethyl-1,6-hexanediamine, 3,3'-diamino-N-methyldipropylamine, N-(3-aminopropyl)-1,3-propanediamine, spermidine, bis(hexamethylene)triamine, N,N',N"-trimethylbis(hexamethylene)triamine, 4-aminomethyl-1,8-octanediamine, N,N'-bis(3-aminopropyl)-1,3-propanediamine, spermine, 4,4'-methylenebis(cyclohexylamine), 1,2-diaminocyclohexane, 1,4-diaminocyclohexane, 1,3-cyclohexanebis(methylamine), 1,4-cyclohexanebis(methylamine), 1,2-bis(aminoethoxy)ethane, 4,9-dioxa-1,12-dodecanediamine, 4,7,10-trioxa-1,13-tridecanediamine, 1,3-diaminohydroxypropane, 4,4'-methylenedipiperidine, 4-(aminomethyl) piperidine, 3-(4-aminobutyl)piperidine, and polyallylamine. Also modified forms of the foregoing primary and secondary amines, ethylenediamines, other diamines and polyamines in which some or all nitrogen atoms are carbamated are similarly applicable. Suitable carbamates include, but are not limited to, t-butyl carbamates (BOC) and t-amyl carbamates, and specifically, N,N'-di(t-butoxycarbonyl)ethylenediamine, N,N'-di(t-amyloxycarbonyl)ethylenediamine, N,N'-di(t-butoxycarbonyl)hexamethylenediamine, and N,N'-di(t-amyloxycarbonyl)hexamethylenediamine.

Once the resist-modifying composition comprising the nitrogen-containing organic compound is coated onto the first resist pattern-bearing substrate, it is baked whereby the nitrogen-containing organic compound is adsorbed to the resist surface. Since acidic carboxyl groups resulting from partial deprotection of acid labile groups are present on the resist surface, the nitrogen-containing organic compound, which generally has high affinity to acidic substances, adsorbs to the carboxyl-bearing resist surface via salt formation or the like. Once adsorbed, the nitrogen-containing organic compound neutralizes the acid, inactivating the first resist pattern. Since the nitrogen-containing organic compound deposited on the substrate can cause a footing profile to the second resist film by deactivating the acid generated in the second resist film, the extra nitrogen-containing organic compound must be removed along with the excess base resin. Effective removal may be performed by rinsing with a solvent that does not attack the resist pattern, for example, a solvent as used in the resist-modifying composition, water, alkaline developer or a mixture thereof. Rinsing may be followed by baking for evaporating off the rinse liquid and for further strongly adhering the nitrogen-containing organic compound to the resist pattern.

For each of the baking after coating of the resist-modifying composition and the baking after rinsing, the baking temperature is preferably in a range of 50 to 170° C., more preferably up to 160° C. For minimizing deformation of the first resist pattern, the baking temperature is more preferably up to 150° C., and even more preferably up to 140° C. It is noted that one or both of these baking steps may be omitted in some cases.

Resist Composition

Now the chemically amplified positive resist compositions used for forming resist patterns are described in detail.

The first resist composition for forming the first resist pattern is preferably a positive resist composition comprising as a base resin a polymer comprising recurring units adapted to increase alkali solubility under the action of acid (i.e., recurring units having an acid labile group) and recurring units having lactone structure. Of these units, inclusion of a polymer comprising recurring units adapted to increase alkali solubility under the action of acid is essential to formulate a chemically amplified positive resist composition. On the other hand, when the base resin in the first positive resist composition contains lactone units as predominant adhesive groups, the dissolution of the first resist composition in the resist-modifying composition is minimized and therefore, the coating of the resist-modifying composition causes least damage to the first resist pattern. As compared with the lactone-free base resin, the first resist pattern after modification treatment according to the invention has a lower solubility in ordinary resist solvents, typically PGMEA, and is thus difficultly soluble in the second positive resist composition. This leads to the advantage that the coating of the second resist composition causes least damage to the first resist pattern.

In a preferred embodiment, the first resist composition comprises as the base resin a polymer comprising recurring units having the general formula (a) and recurring units having the general formula (b).

(a)

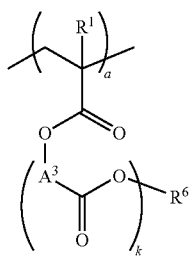

(b)

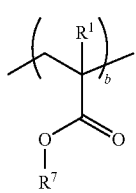

Herein R¹ is each independently hydrogen or methyl, A³ is each independently a divalent organic group, R⁶ is an acid labile group, R⁷ is a monovalent organic group having lactone structure, k is 0, 1 or 2, "a" and "b" indicative of molar fractions of recurring units (a) and (b) in the polymer, respectively, are numbers in the range: $0 \leq a<1.0$, $0<b<1.0$, and $0<a+b \leq 1.0$.

In formula (a), A³ is each independently a divalent organic group. Examples include, but are not limited to, methylene, ethylene, trimethylene, propylene, tetramethylene, 2,6-norbornanelactone-3,5-diyl, and 7-oxa-2,6-norbornanelactone-3,5-diyl.

The acid labile group represented by R⁶ may be selected from a variety of such groups to be deprotected with the acid generated from the photoacid generator to be described later. It may be any of well-known acid labile groups commonly used in prior art resist compositions, especially chemically amplified resist compositions. Examples of the acid labile group are groups of the following general formulae (L1) to (L4), and tertiary alkyl groups of 4 to 20 carbon atoms, preferably 4 to 15 carbon atoms.

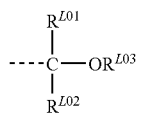  (L1)

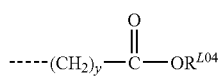  (L2)

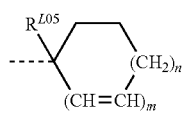  (L3)

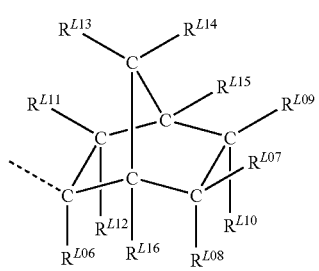  (L4)

Herein, the broken line denotes a valence bond. In formula (L1), $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, adamantyl, and adamantylmethyl. $R^{L03}$ is a monovalent hydrocarbon group of 1 to 18 carbon atoms, preferably 1 to 10 carbon atoms, which may contain a heteroatom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. Illustrative examples of the straight, branched or cyclic alkyl groups are as exemplified above for $R^{L01}$ and $R^{L02}$, and examples of the substituted alkyl groups are as shown below.

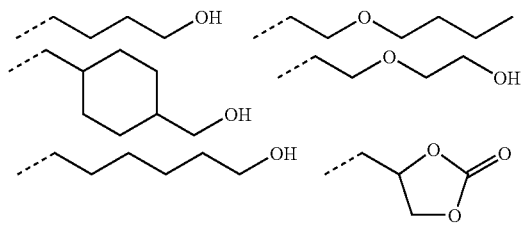

A pair of $R^{L01}$ and $R^{L02}$, $R^{L01}$ and $R^{L03}$, or $R^{L02}$ and $R^{L03}$ may bond together to form a ring with carbon and oxygen atoms to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 2-(tricyclo[5.2.1.0²,⁶]decan-8-yl)propan-2-yl, 2-(tetracyclo[4.4.0.1²,⁵.1⁷,¹⁰]dodecan-3-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, 8-methyl-8-tricyclo[5.2.1.0²,⁶]decyl, 8-ethyl-8-tricyclo[5.2.1.0²,⁶]decyl, 4-methyl-4-tetracyclo[4.4.0.1²,⁵.1⁷,¹⁰]dodecyl, 3-ethyl-3-tetracyclo[4.4.0.1²,⁵.1⁷,¹⁰]dodecyl, and the like. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

In formula (L3), $R^{L05}$ is an optionally substituted, straight, branched or cyclic $C_1$-$C_{10}$ alkyl group or an optionally substituted $C_6$-$C_{20}$ aryl group. Examples of the optionally substituted alkyl groups include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, and substituted forms of such groups in which some hydrogen atoms are replaced by hydroxyl, alkoxy, carboxy, alkoxycarbonyl, oxo, amino, alkylamino, cyano, mercapto, alkylthio, sulfo or other groups or in which some methylene groups are replaced by oxygen or sulfur atoms. Examples of optionally substituted aryl groups include phenyl, methylphenyl, naphthyl, anthryl, phenanthryl, and pyrenyl. Letter m is equal to 0 or 1, n is equal to 0, 1, 2 or 3, and 2m+n is equal to 2 or 3.

In formula (L4), $R^{L06}$ is an optionally substituted, straight, branched or cyclic $C_1$-$C_{10}$ alkyl group or an optionally substituted $C_6$-$C_{20}$ aryl group. Examples of these groups are the same as exemplified for $R^{L05}$. $R^{L07}$ to $R^{L16}$ independently represent hydrogen or monovalent hydrocarbon groups of 1 to 15 carbon atoms. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom(s) to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are those exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

Of the acid labile groups of formula (L1), the straight and branched ones are exemplified by the following groups.

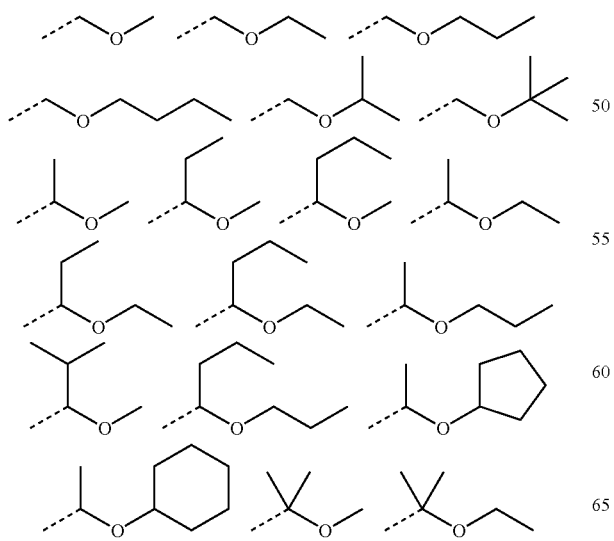

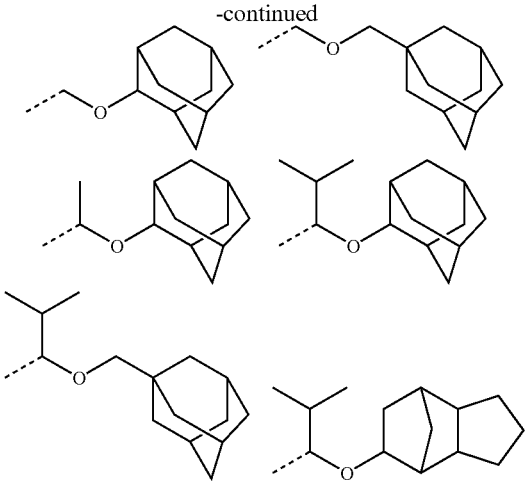

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-propylcyclopentyl, 1-isopropylcyclopentyl, 1-butylcyclopentyl, 1-sec-butylcyclopentyl, 1-cyclohexylcyclopentyl, 1-(4-methoxybutyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 1-methyl-2-cyclopentenyl, 1-ethyl-2-cyclopentenyl, 1-methyl-2-cyclohexenyl, and 1-ethyl-2-cyclohexenyl groups.

Of the acid labile groups of formula (L4), those groups of the following formulae (L4-1) to (L4-4) are preferred.

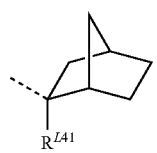

(L4-1)

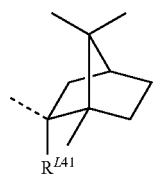

(L4-2)

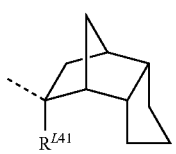

(L4-3)

(L4-4)

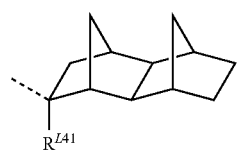

(L4-4-4)

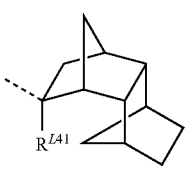

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

(L4-3-1)

(L4-3-2)

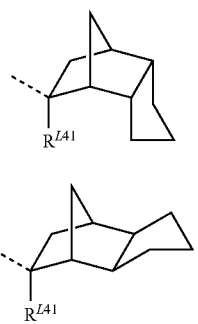

Similarly, the general formula (L4-4) represents one or a mixture of two or more selected from groups having the following general formulas (L4-4-1) to (L4-4-4).

(L4-4-1)

(L4-4-2)

(L4-4-3)

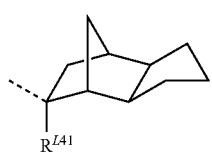

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo[2.2.1]heptane structure as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

(L4-1-endo)

(L4-2-endo)

(L4-3-endo)

(L4-4-endo)

Illustrative examples of the acid labile group of formula (L4) are given below.

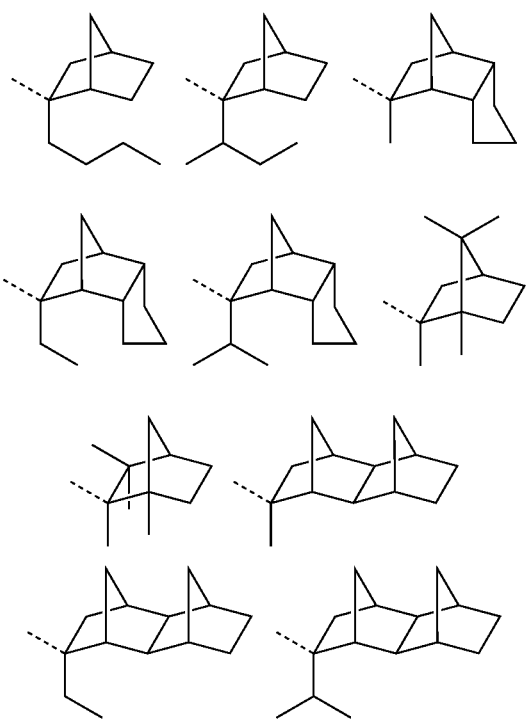
Examples of the tertiary $C_4$-$C_{20}$ alkyl groups are as exemplified for $R^{L04}$.
Examples of the recurring units (a) are given below, but not limited thereto.
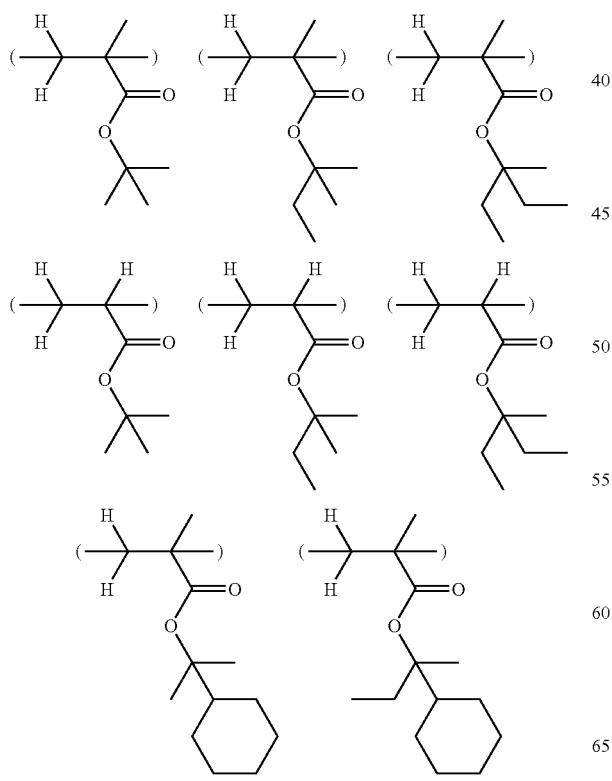
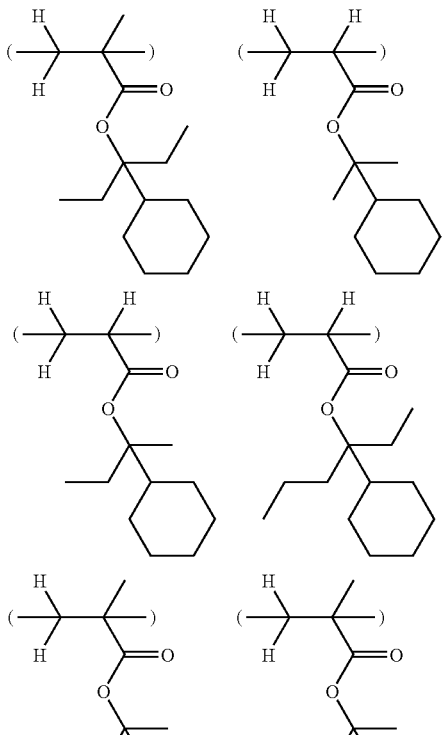
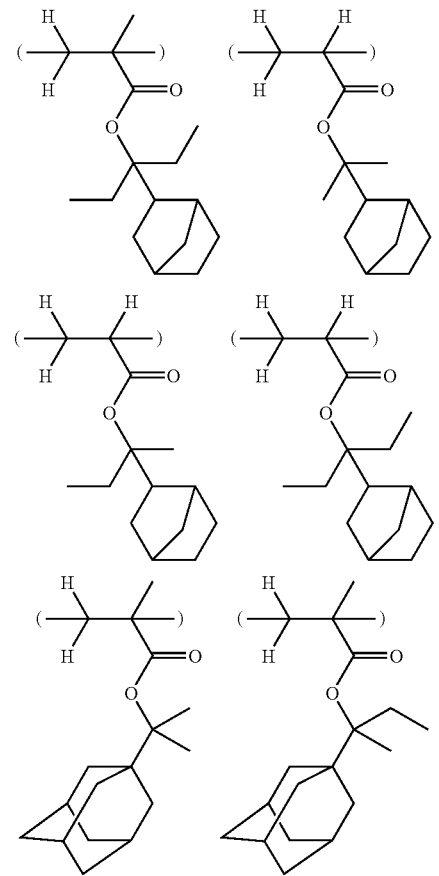

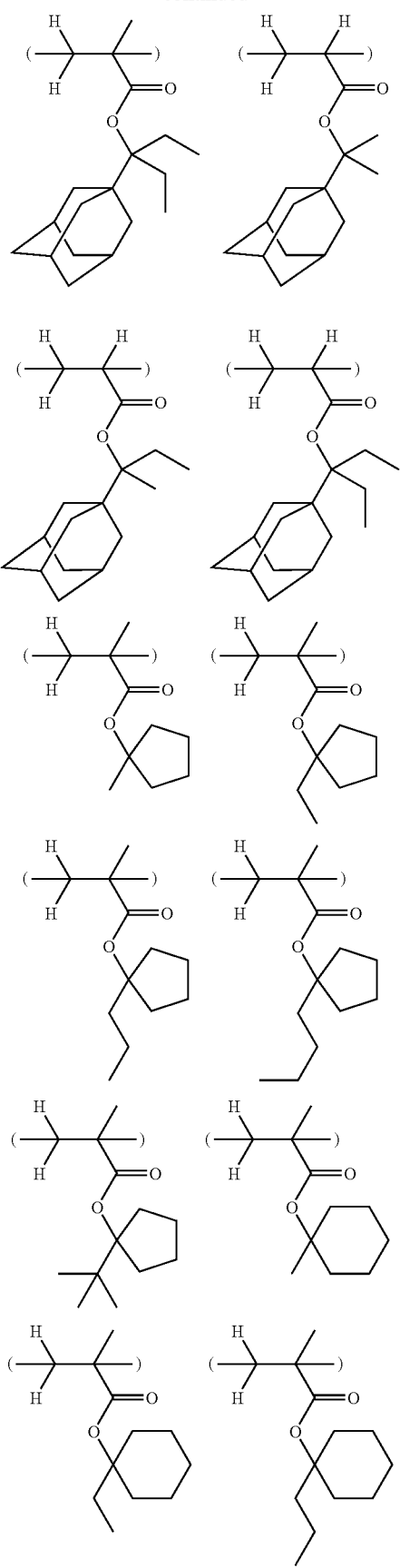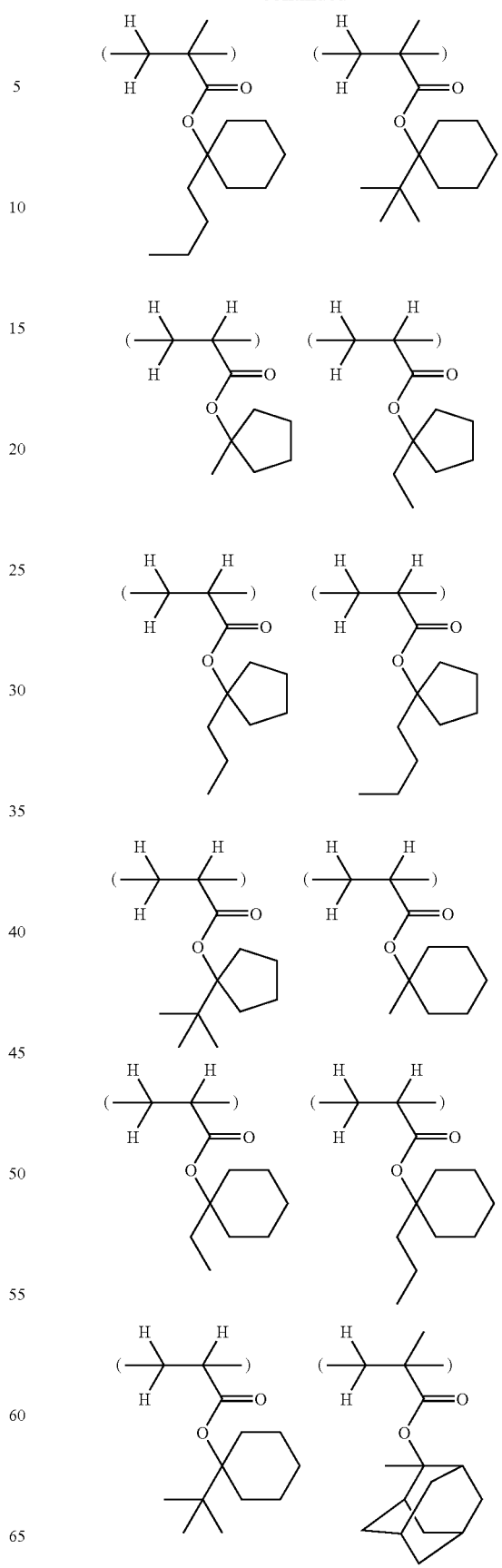

-continued
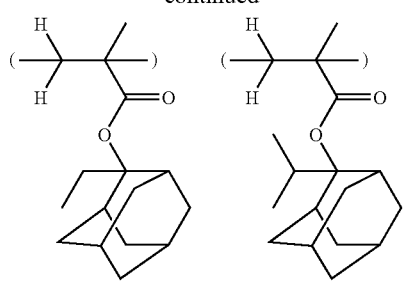
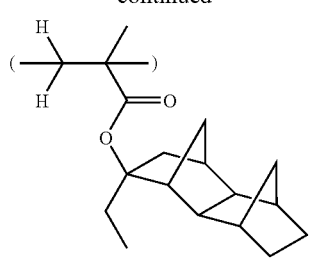
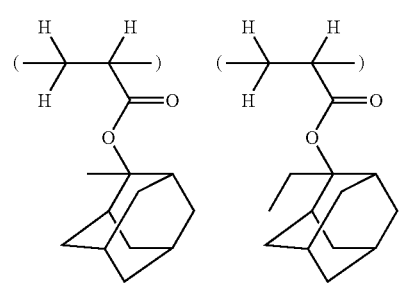
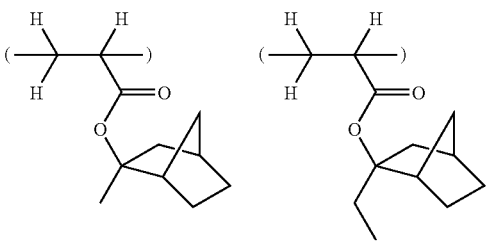
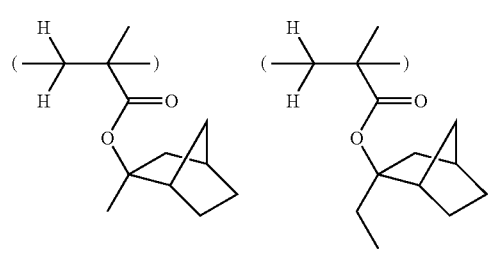
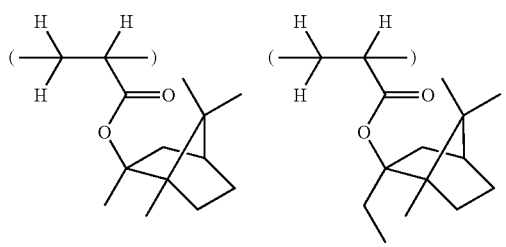
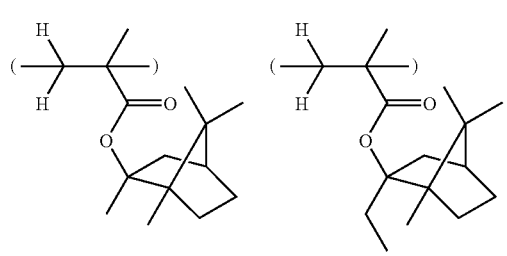
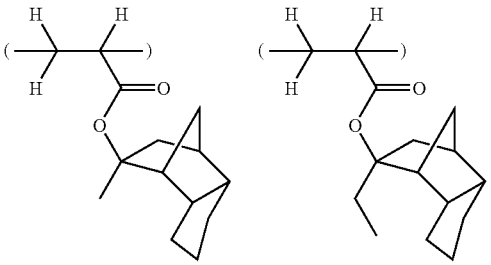
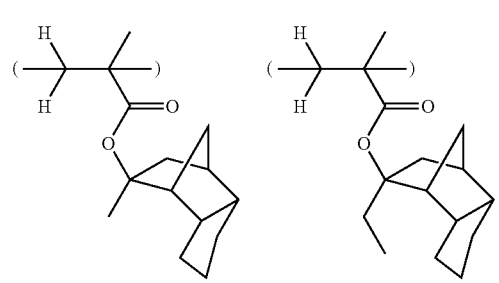
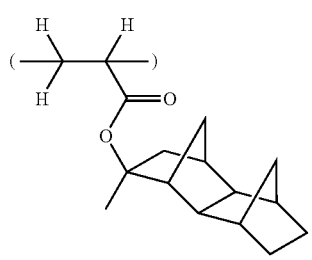
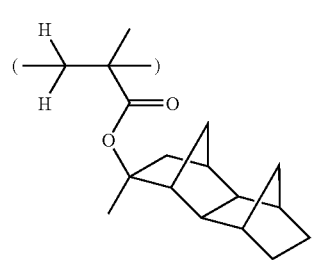
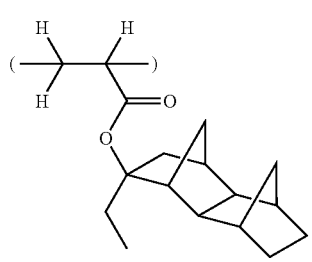

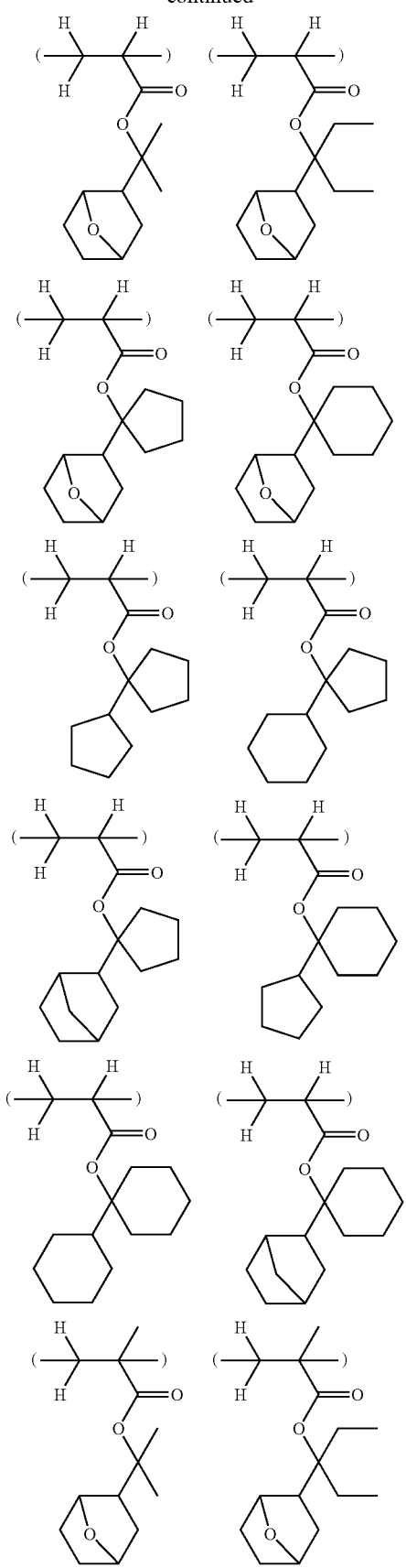
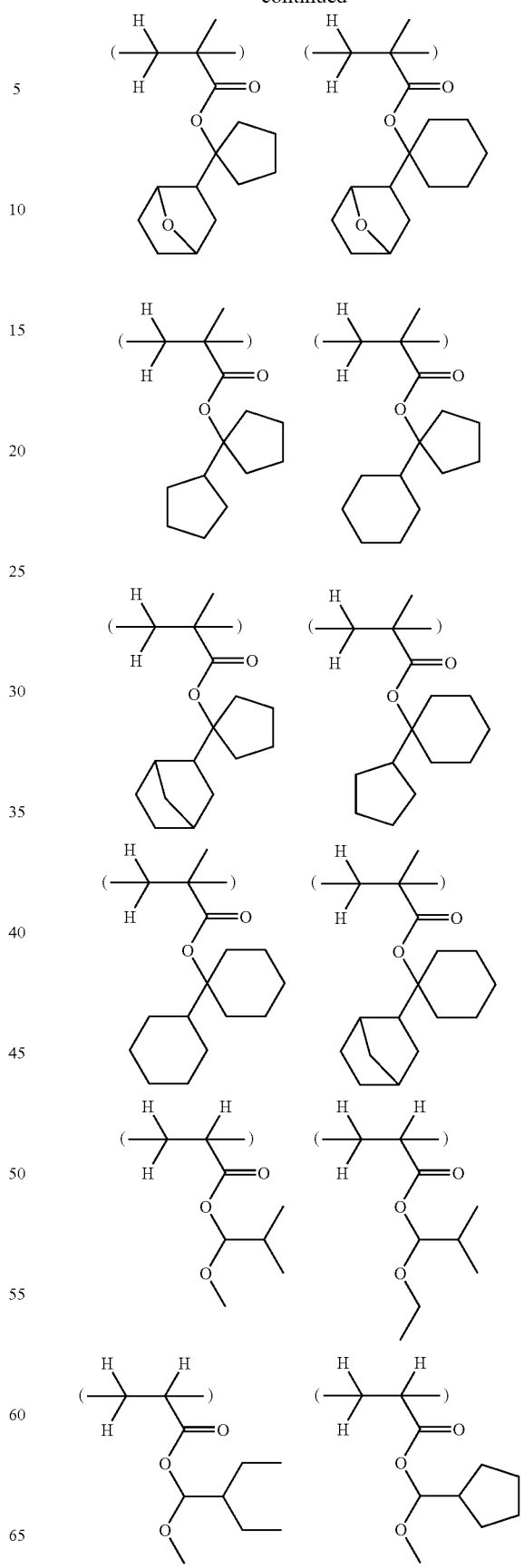

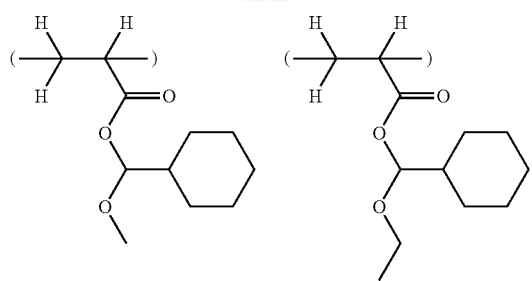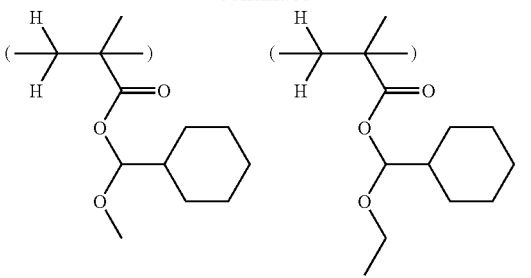

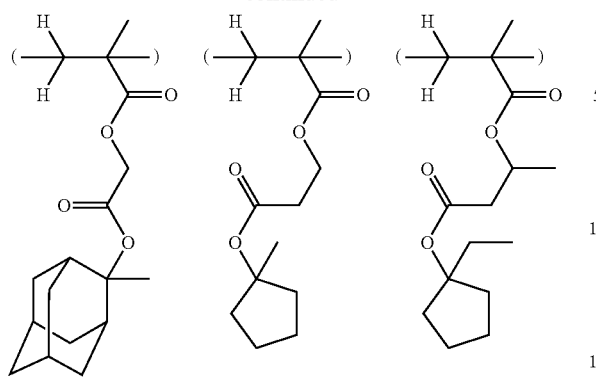
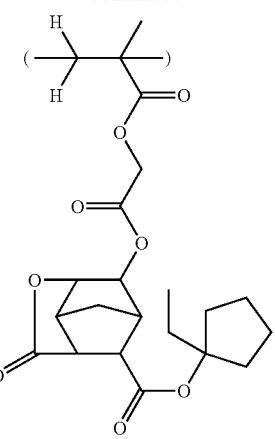
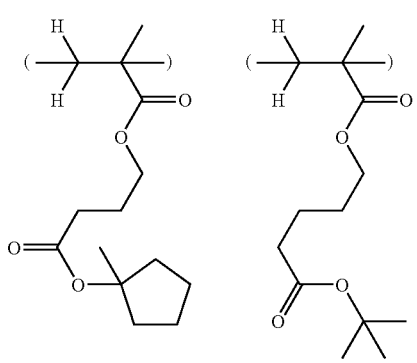
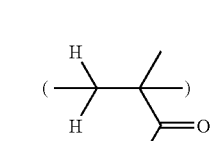
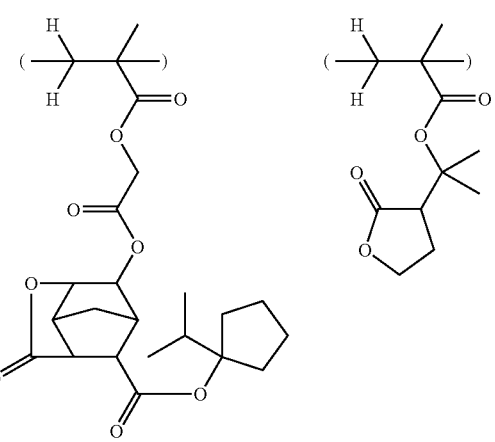
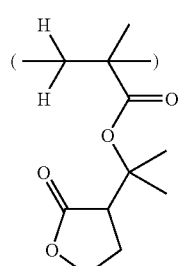
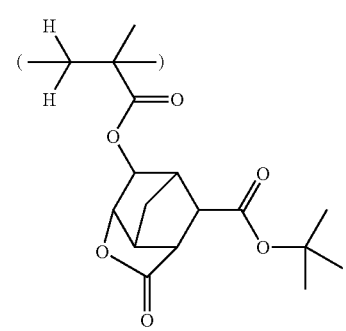
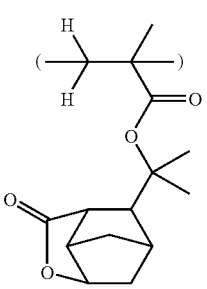
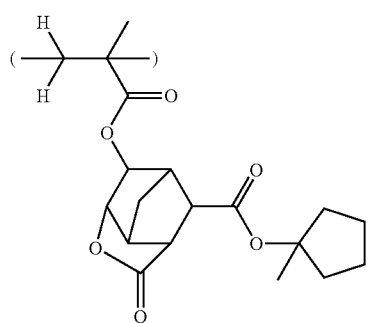
Examples of the recurring units (b) are given below, but not limited thereto.
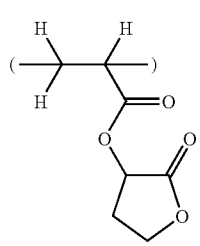
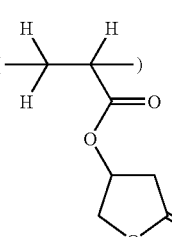

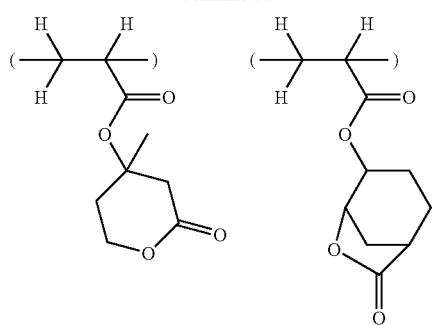
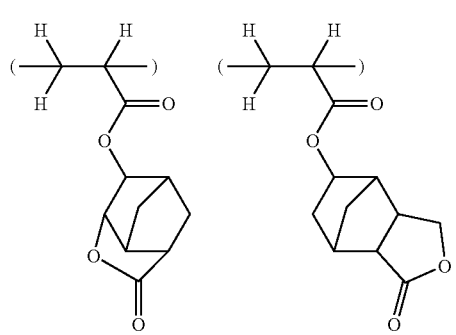
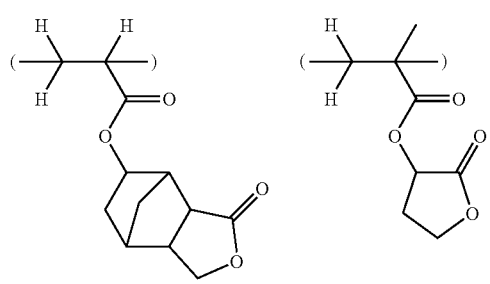
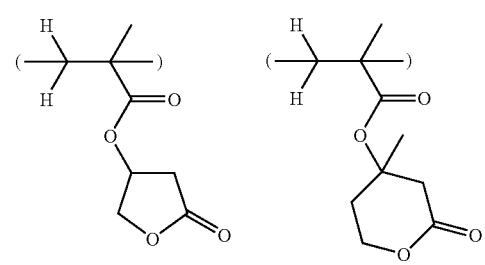
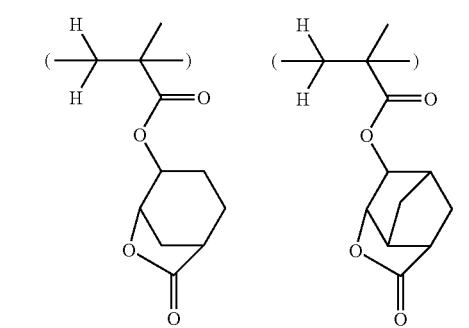
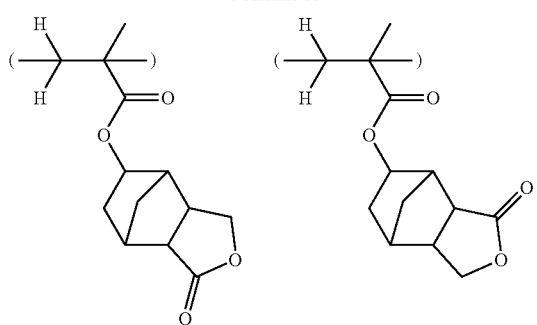
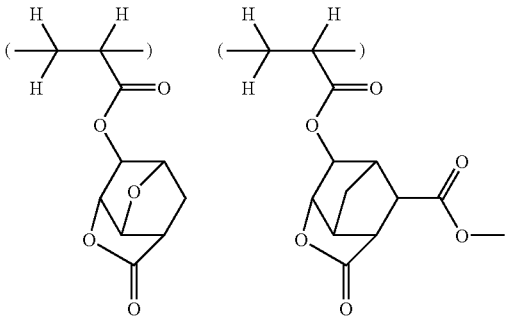
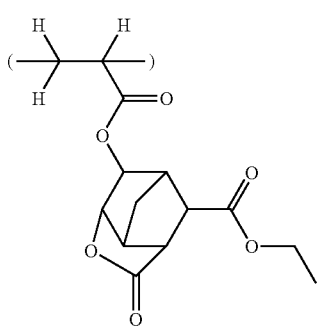
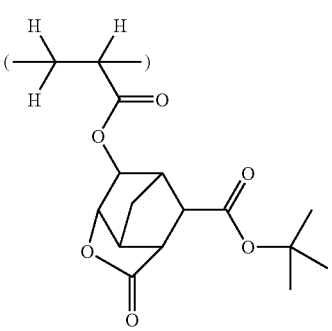
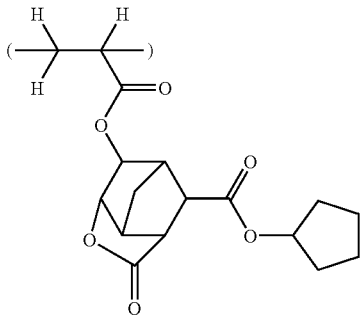

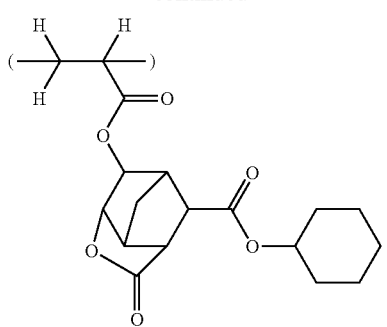
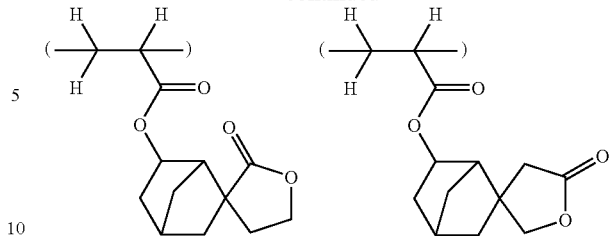
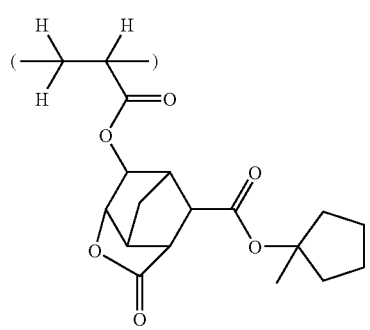
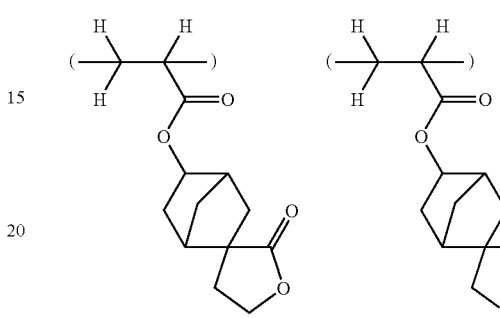
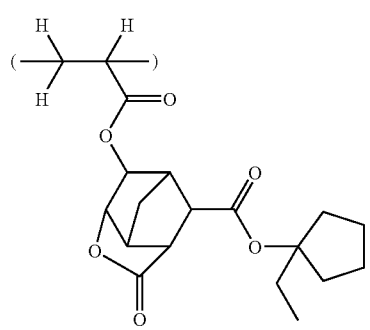
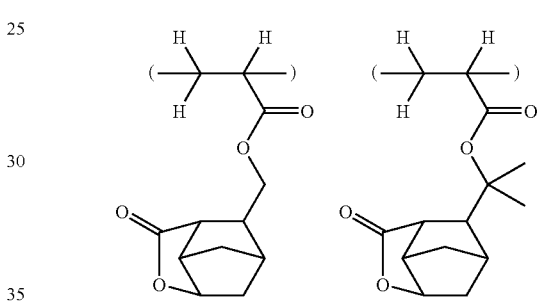
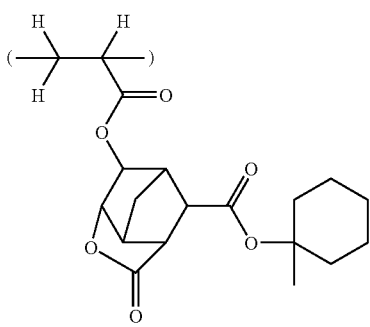
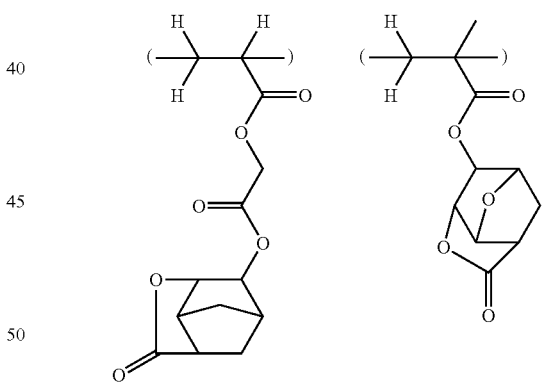
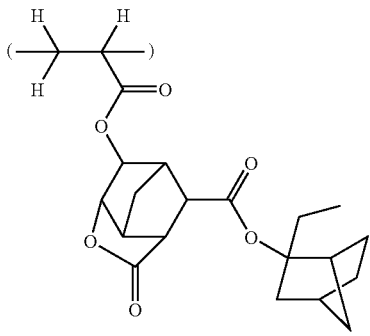
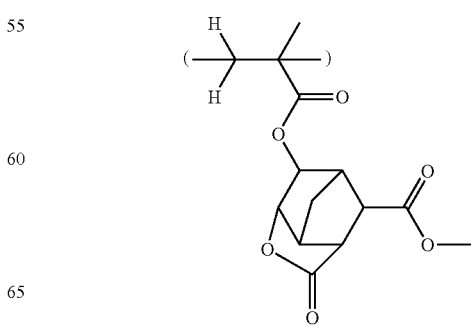

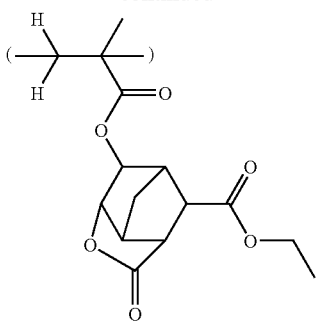
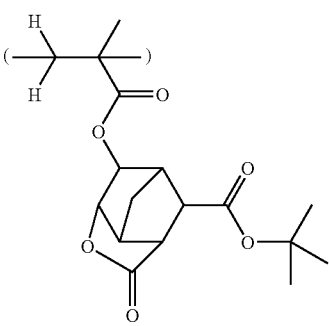
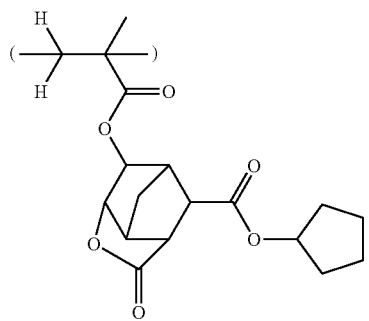
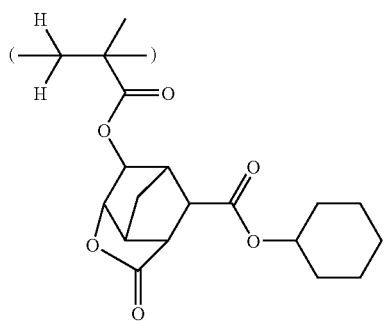
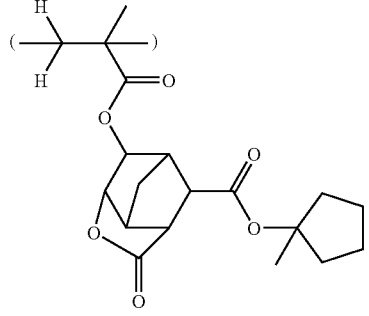
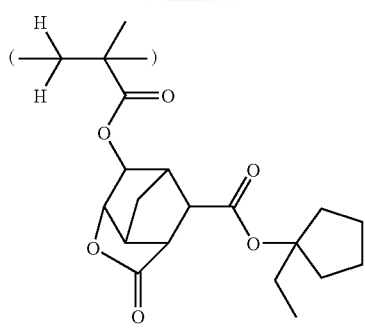
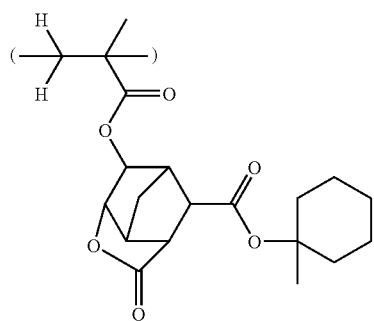
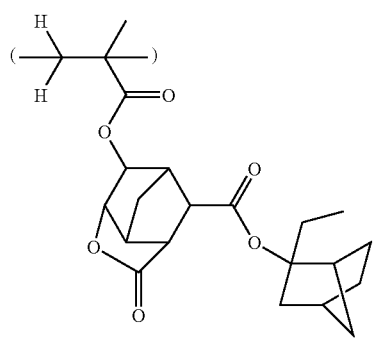
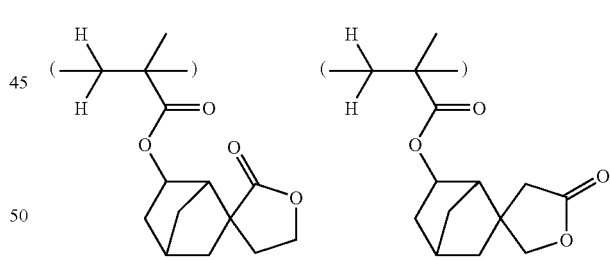
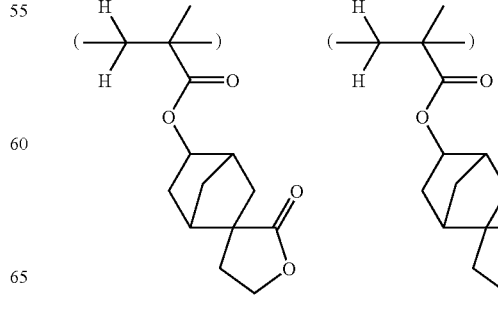

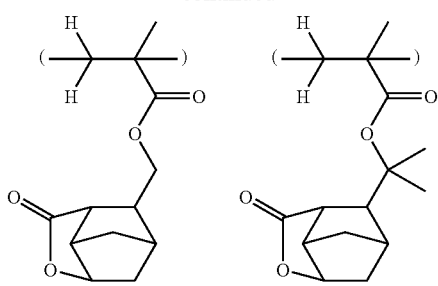
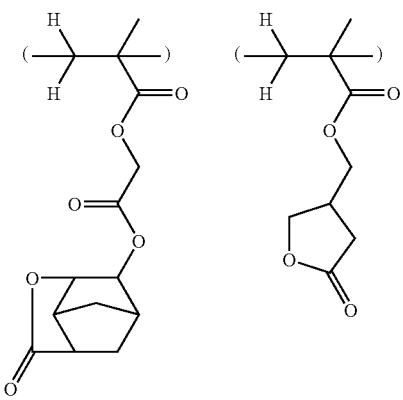
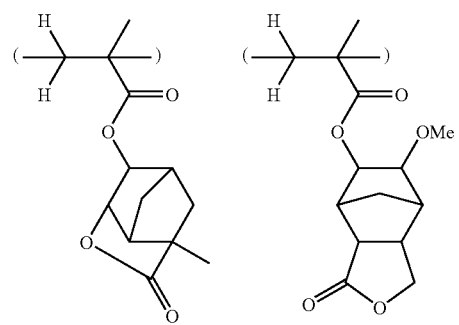
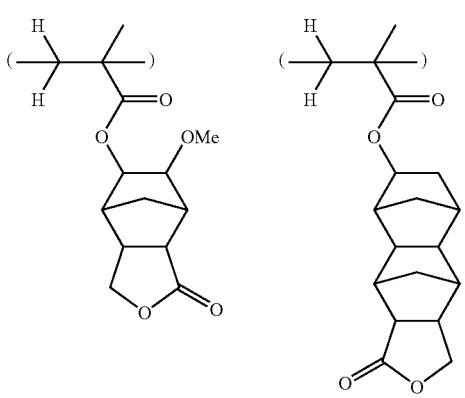
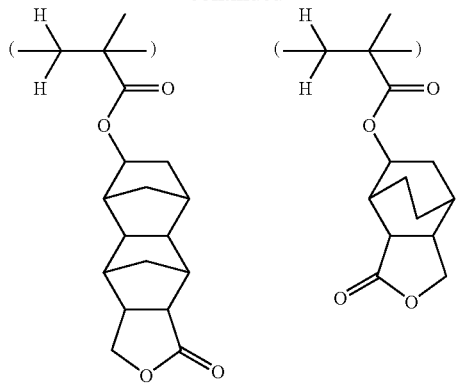
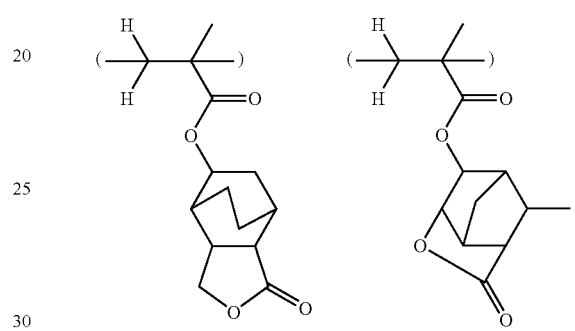

The recurring units (a) and (b) each may be of one type or a combination of two or more types. In the polymer, the recurring units (a) and (b) are incorporated at molar fractions "a" and "b," which satisfy the range: $0<a<1.0$, $0<b<1.0$, and $0<a+b\leq1.0$, preferably $0.15<a<0.70$, $0.05<b<0.60$, and $0.2<a+b\leq1.0$.

It is meant by $a+b<1.0$ that the polymer comprises other recurring units in addition to the recurring units (a) and (b). Suitable other recurring units include, but are not limited to, recurring units derived from the monomers listed below. In the formulae, $R^1$ is hydrogen or methyl.

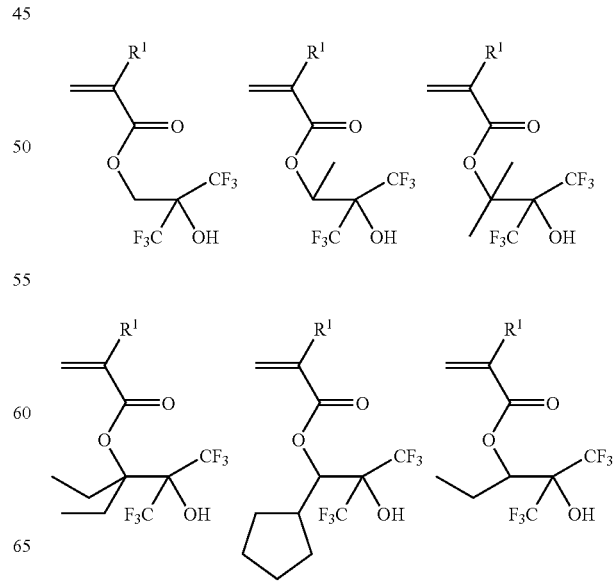

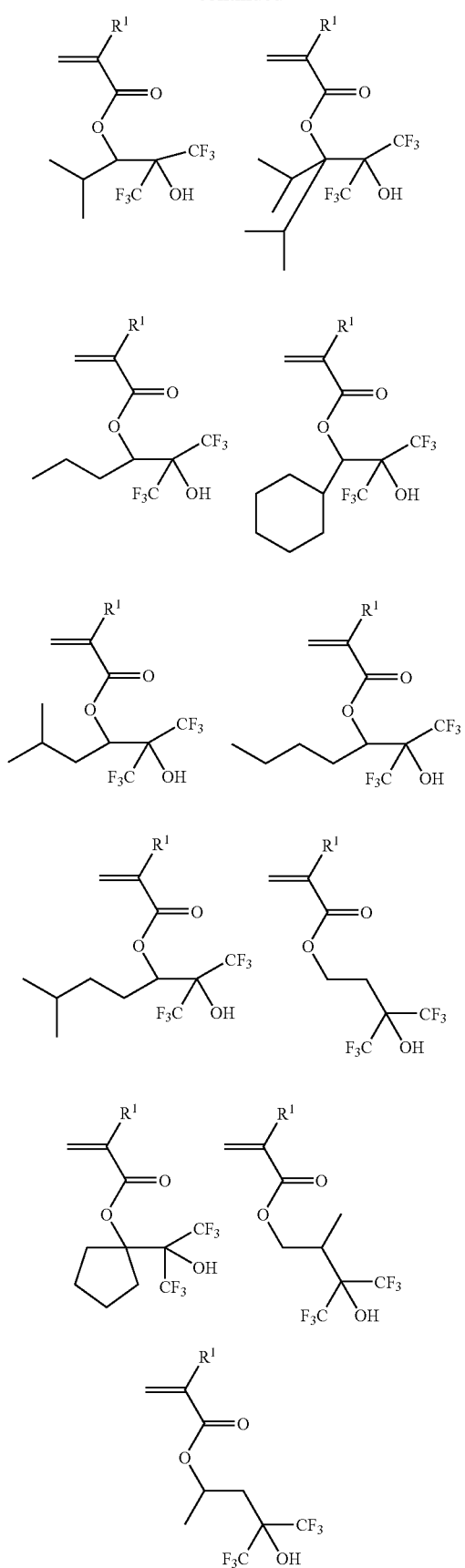
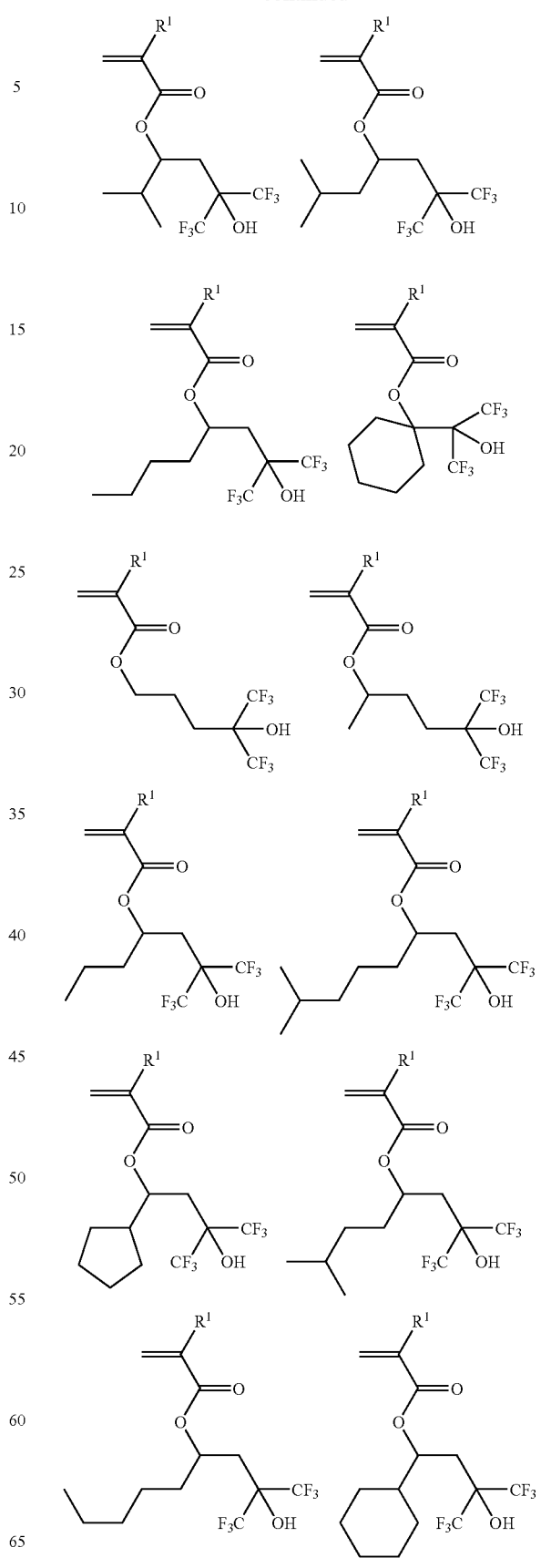

-continued
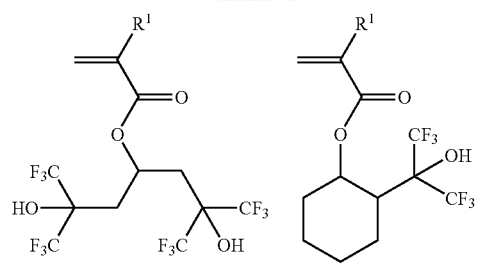
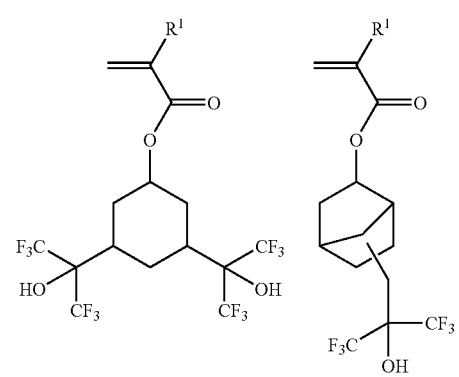
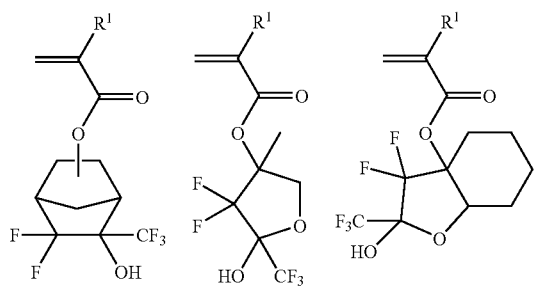
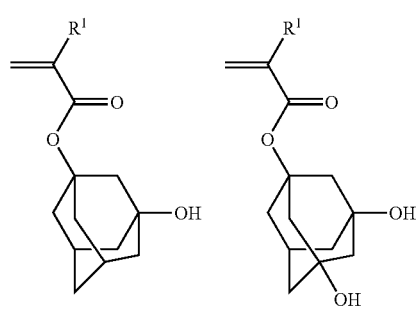
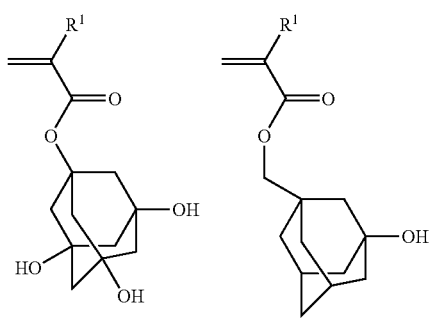
-continued
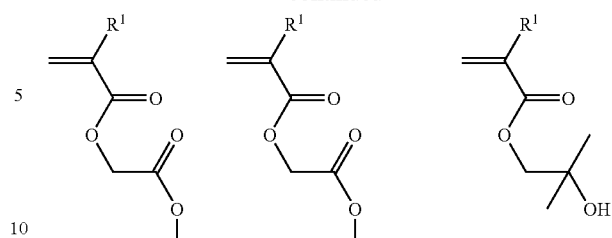
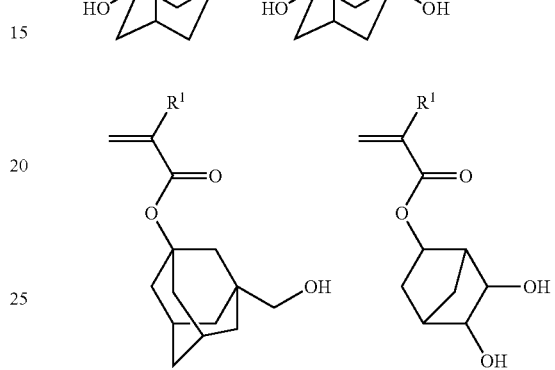
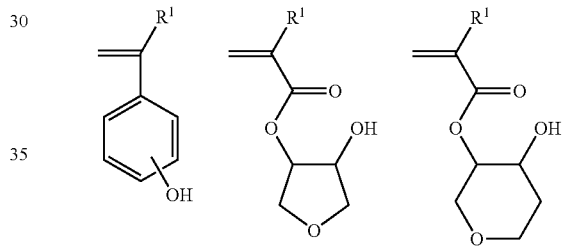
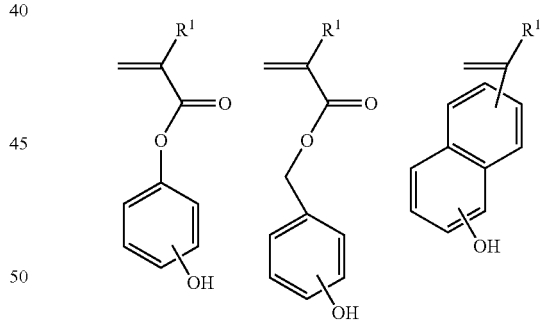
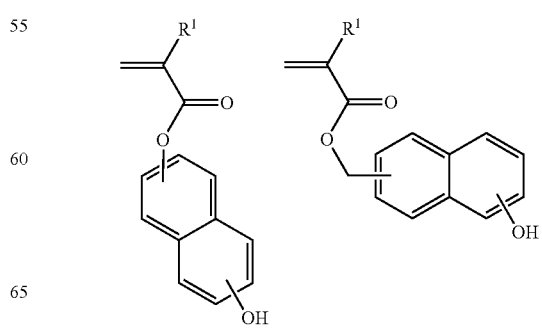

-continued

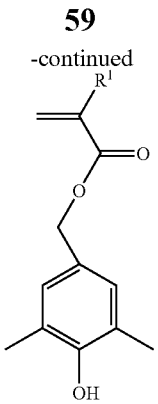

The second resist composition used in second exposure may be selected from a wide variety of well-known chemically amplified positive resist compositions as long as they have the desired lithography performance. Resist compositions comprising the same base resin as in the first resist composition may be used. Resist compositions meeting the following requirement are advantageously applicable. With respect to the PEB temperature, a PEB temperature of the second resist process which is lower than that of the first resist process is preferred for minimizing the damage to the first resist pattern by the second exposure and development. More preferably the difference in PEB temperature between the first and second resist processes is at least 10° C. With respect to the solvent, if the solvent for the second resist composition does not dissolve or substantially dissolve the first resist pattern prior to the modification treatment, this solvent is preferred in minimizing the damage to the first resist pattern during coating of the second resist composition. Preferred examples of the solvent are as exemplified above for the solvent in the resist-modifying composition.

The following description applies to both the first and second resist compositions.

The polymer serving as the base resin in the resist composition used in the pattern forming process should preferably have a Mw in the range of 1,000 to 500,000, and more preferably 2,000 to 30,000, as measured by GPC using polystyrene standards. With too low a Mw, there may result a loss of resolution and insufficient retention of resist pattern due to an increased solubility of the resin in solvent. A polymer with too high a Mw may lose alkali solubility and give rise to a footing phenomenon after pattern formation.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.6, in order to provide a resist composition suitable for micropatterning to a small feature size. It is understood that a blend of two or more polymers which differ in compositional ratio, molecular weight or dispersity is acceptable.

The polymer used herein may be synthesized by any desired method, for example, by dissolving unsaturated bond-containing monomers corresponding to the respective units in an organic solvent, adding a polymerization initiator, typically radical polymerization initiator thereto, and effecting polymerization. Examples of the organic solvent which can be used for polymerization include toluene, benzene, tetrahydrofuran, diethyl ether, dioxane, isopropyl alcohol, 2-butanone, γ-butyrolactone, 1-methoxy-2-propyl acetate, and mixtures thereof. Examples of the radical polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 40° C. to the boiling point of the solvent for polymerization to take place. The reaction time is 1 to 100 hours, preferably 3 to 20 hours. The acid labile group that has been incorporated in the monomer may be kept as such, or the acid labile group may be once removed with an acid catalyst and thereafter protected or partially protected. The polymer serving as the base resin is not limited to one type and a mixture of two or more polymers may be added. The use of plural polymers allows for adjustment of resist properties.

The first or second positive resist composition used herein may include an acid generator in order for the composition to function as a chemically amplified positive resist composition. Typical of the acid generator used herein is a photoacid generator (PAG) capable of generating an acid in response to actinic light or radiation. It is any compound capable of generating an acid upon exposure to high-energy radiation. Suitable photoacid generators include sulfonium salts, iodonium salts, sulfonyldiazomethane, N-sulfonyloxyimide, and oxime-O-sulfonate acid generators. The acid generators may be used alone or in admixture of two or more. Exemplary acid generators are described in U.S. Pat. No. 7,537,880 (JP-A 2008-111103, paragraphs [0122] to [0142]). The acid generator is typically used in an amount of 0.1 to 20 parts, and preferably 0.1 to 10 parts by weight per 100 parts by weight of the base resin.

The resist composition may further comprise an organic solvent, basic compound, dissolution regulator, surfactant, and acetylene alcohol, alone or in combination.

Examples of the organic solvent added to the first and second resist composition are described in U.S. Pat. No. 7,537,880 (JP-A 2008-111103, paragraphs [0144] to [0145]. The organic solvent used herein may be any organic solvent in which the base resin, acid generator, and other components are soluble. Illustrative, non-limiting, examples of the organic solvent include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, PGMEA, and mixtures thereof because the acid generator is most soluble therein.

In the second resist composition, not only the organic solvents mentioned above, but also $C_3$-$C_8$ alcohols and $C_6$-$C_{12}$ ethers are useful. Examples of $C_3$-$C_8$ alcohol include n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2- butanol, 3,3-dimethyl-1-butanol, 3,3-dimethyl-2-butanol, 2,2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol. Examples of $C_6$-$C_{12}$ ether include methyl cyclopentyl ether, methyl cyclohexyl ether, anisole, diisopropyl ether, diisobutyl ether, diisopentyl ether, di-n-pentyl ether, methyl cyclopentyl ether, methyl cyclohexyl ether, di-n-butyl ether, di-sec-butyl ether, diisopentyl ether, di-sec-pentyl ether, di-tert-amyl ether, and di-n-hexyl ether.

An appropriate amount of the organic solvent used is 200 to 3,000 parts, especially 400 to 2,500 parts by weight per 100 parts by weight of the base resin.

For use in the first and second resist compositions, exemplary basic compounds are described in JP-A 2008-111103 (U.S. Pat. No. 7,537,880), paragraphs [0146] to [0164], and exemplary surfactants in paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. These components may be blended in standard amounts.

Process

Now, the double patterning process is described. FIGS. 2 to 4 illustrate prior art double patterning processes.

Referring to FIG. 2, one exemplary double patterning process I is illustrated. A photoresist film 30 is coated and formed on a processable layer 20 on a substrate 10. To prevent the photoresist pattern from collapsing, the technology intends to reduce the thickness of photoresist film. One approach taken to compensate for a lowering of etch resistance of thinner film is to process the processable layer using a hard mask. The double patterning process illustrated in FIG. 2 uses a multilayer coating in which a hard mask 40 is laid between the photoresist film 30 and the processable layer 20 as shown in FIG. 2A. In the double patterning process, the hard mask is not always necessary, and an underlayer film in the form of a carbon film and a silicon-containing intermediate film may be laid instead of the hard mask, or an organic antireflective coating may be laid between the hard mask and the photoresist film. The hard mask used herein may be of $SiO_2$, SiN, SiON, p-Si or TiN, for example. The resist material used in double patterning process I is a positive resist composition. In the process, the resist film 30 is exposed and developed (FIG. 2B), the hard mask 40 is then dry etched (FIG. 2C), the photoresist film is stripped, and a second photoresist film 50 is coated, formed, exposed, and developed (FIG. 2D). Then the processable layer 20 is dry etched (FIG. 2E). Since this etching is performed using the hard mask pattern and the second photoresist pattern as a mask, variations occur in the pattern size after etching of the processable layer due to a difference in etch resistance between hard mask 40 and photoresist film 50.

To solve the above problem, a double patterning process II illustrated in FIG. 3 involves laying two layers of hard mask 41 and 42. The upper layer of hard mask 42 is processed using a first resist pattern, the lower layer of hard mask 41 is processed using a second resist pattern, and the processable layer is dry etched using the two hard mask patterns. It is essential to establish a high etching selectivity between first hard mask 41 and second hard mask 42. Thus the process is rather complex.

FIG. 4 illustrates a double patterning process III using a trench pattern. This process requires only one layer of hard mask. However, since the trench pattern is lower in optical contrast than the line pattern, the process has the drawbacks of difficult resolution of the pattern after development and a narrow margin. It is possible to form a wide trench pattern and induce shrinkage by the thermal flow or RELACS method, but this process is more intricate. Using negative resist materials enables exposure at a high optical contrast, but the negative resist materials generally have the drawbacks of low contrast and low resolution capability as compared with positive resist materials. The trench process requires a very high accuracy of alignment because any misalignment between the first and second trenches leads to a variation in the width of the finally remaining lines.

The double patterning processes I to III described above have the drawback that two hard mask etchings are involved. Due to a concomitant drop of throughput, the processes are uneconomical.

FIG. 1 illustrates the double patterning process of the invention. FIG. 1A shows a structure wherein a first resist film 30 of the first positive resist composition is formed on a processable layer 20 on a substrate 10 via a hard mask 40 as in FIG. 2A. The first resist film 30 is exposed patternwise and developed to form a first resist pattern (FIG. 1B). The resist film 30 is then treated with the resist-modifying composition for modification into a first resist pattern 30a which is inactivated to the second resist process (FIG. 1C). The excess resist-modifying composition is desirably stripped off using water or alkaline developer. The structure may then be baked in order to promote modification of the first resist pattern. The preferred baking is at 50 to 170° C. for 5 to 600 seconds. A temperature higher than 170° C. is undesired because the resist pattern may be deformed due to thermal flow or shrunk as a result of deprotection of acid labile groups. The baking temperature is preferably up to 150° C., more preferably up to 140° C., and even more preferably up to 130° C. The pattern is little deformed if baking is at or below 130° C.

Figure 1D:
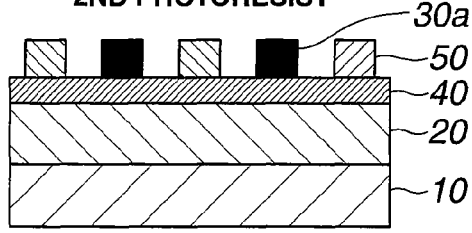
FIG. 1D shows a second resist film being formed, exposed and developed.
Figure 1E:
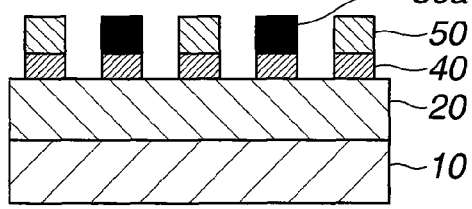
FIG. 1E shows the hard mask being etched.
Figure 1F:
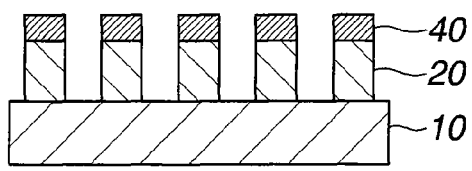
FIG. 1F shows the processable layer being etched.
Figure 2A:
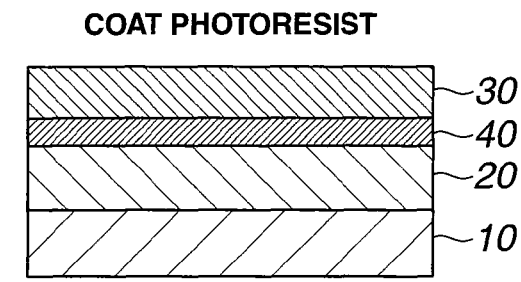
FIG. 2A shows a laminate of substrate, processable layer, hard mask and resist film.
Figure 2B:
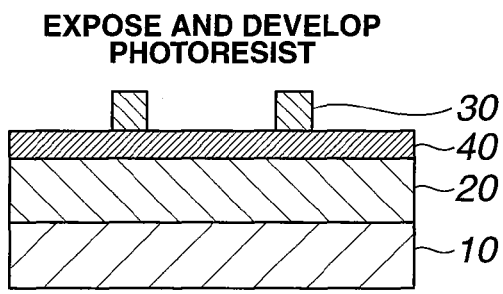
FIG. 2B shows the resist film being exposed and developed.
Figure 2C:
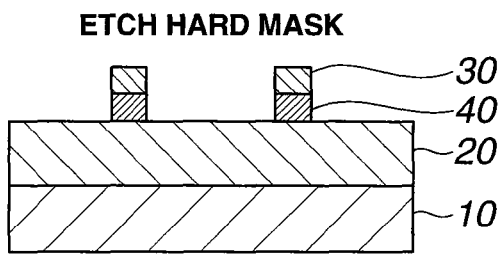
FIG. 2C shows the hard mask being etched.
Figure 2D:
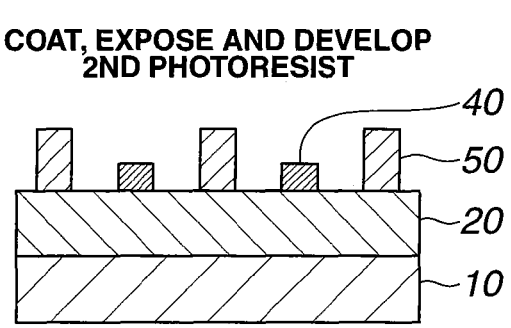
FIG. 2D shows a second resist film being formed, exposed and developed.
Figure 2E:
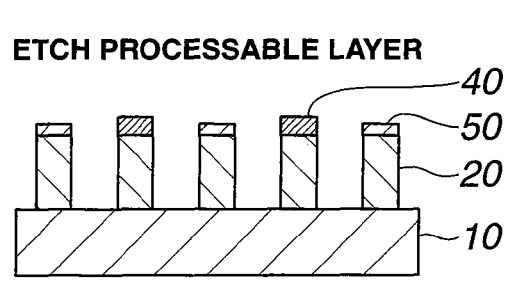
FIG. 2E shows the processable layer being etched.
Figure 3A:
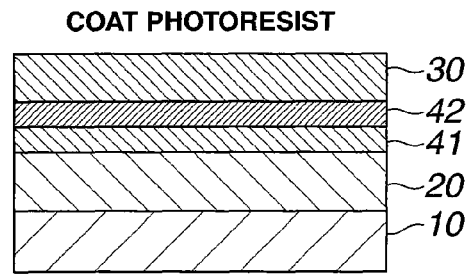
FIG. 3A shows a laminate of substrate, processable layer, 1st and 2nd hard masks and resist film.
Figure 3B:
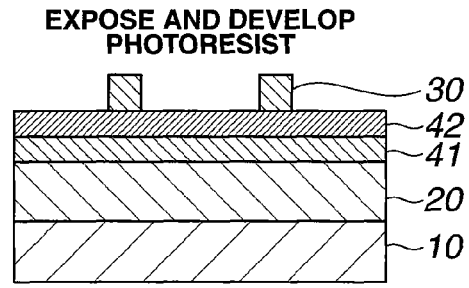
FIG. 3B shows the resist film being exposed and developed.
Figure 3C:
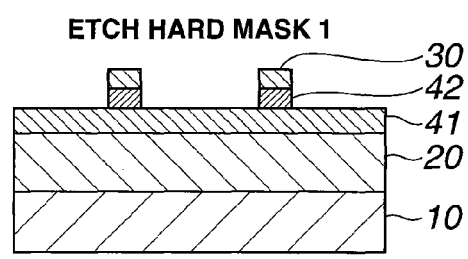
FIG. 3C shows the 2nd hard mask being etched.
Figure 3D:
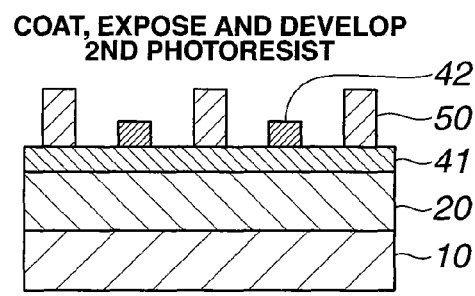
FIG. 3D shows, after removal of the first resist film, a second resist film being formed, exposed and developed.
Figure 3E:
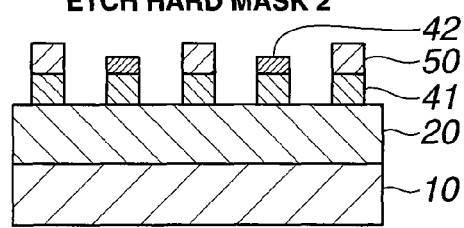
FIG. 3E shows the 1st hard mask being etched.
Figure 3F:
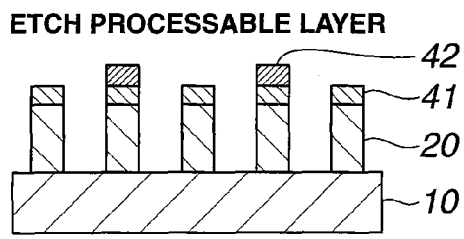
FIG. 3F shows the processable layer being etched.

Next, the second resist composition is coated on the first pattern-bearing substrate to form a second resist film. Through patternwise exposure and development of the second resist film, a second resist pattern 50 is formed in an area where features of the inactivated first resist pattern 30a have not been formed (FIG. 1D). Thereafter, the hard mask 40 is etched (FIG. 1E). The processable layer 20 is dry etched, and finally, the inactivated first resist pattern 30a and second resist pattern 50 are removed (FIG. 1F). Single etching of the hard mask leads to a high throughput, making the process economical.

In the process illustrated in FIG. 1, the second pattern is formed in spaces of the first pattern for reducing the distance between features of the final resist pattern. In one embodiment, both the first and second resist patterns are mainly composed of lines which extend parallel or substantially parallel to each other. In this embodiment, the pattern forming process and the resist-modifying composition are effective partially because pattern collapse is prohibited.

The substrate 10 used herein is generally a silicon substrate. The processable layer 20 used herein includes $SiO_2$, SiN, SiON, SiOC, p-Si, α-Si, TiN, WSi, BPSG, SOG, Cr, CrO, CrON, MoSi, low dielectric film, and etch stopper film. The hard mask 40 is as described above. Understandably, an undercoat film in the form of a carbon film and an intermediate intervening layer in the form of a silicon-containing intermediate film or organic antireflective coating may be formed instead of the hard mask.

In the process of the invention, a first resist film of a first positive resist composition is formed on the processable layer directly or via an intermediate intervening layer such as the hard mask. The first resist film preferably has a thickness of 10 to 1,000 nm, and more preferably 20 to 500 nm. The first resist film is heated or pre-baked prior to exposure, with the preferred pre-baking conditions including a temperature of 60 to 180° C., especially 70 to 150° C. and a time of 10 to 300 seconds, especially 15 to 200 seconds.

This is followed by patternwise exposure. For the exposure, preference is given to high-energy radiation having a wavelength of 140 to 250 nm, and especially ArF excimer laser radiation of 193 nm. The exposure may be done either in air or in a dry atmosphere with a nitrogen stream, or by immersion lithography in water. The ArF immersion lithography uses deionized water or liquids having a refractive index of at least 1 and highly transparent to the exposure wavelength such as alkanes as the immersion solvent. The immersion lithography involves prebaking a resist film and exposing the resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective coating may be applied onto the resist film after pre-baking for preventing any leach-outs from the resist film and improving water slip on the film surface. The resist protective coating used in the immersion lithography is preferably formed from a solution of a polymer having 1,1,1,3,3,3-hexafluoro-2-propanol residues which is non-soluble in water, but soluble in an alkaline developer liquid, in a solvent selected from alcohols of at least 4 carbon atoms, ethers of 8 to 12 carbon atoms, and mixtures thereof. After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film.

To the first resist composition, an additive for rendering the resist surface water repellent may be added. A typical additive is a polymer having a fluoroalcohol group. After spin coating, the polymer segregates toward the resist surface to reduce the surface energy, thereby improving water slip. Such additives are described in JP-A 2007-297590 and JP-A 2008-122932.

Exposure is preferably carried out so as to provide an exposure dose of about 1 to 200 mJ/cm$^2$, more preferably about 10 to 100 mJ/cm$^2$. This is followed by PEB on a hot plate at 60 to 150° C. for 1 to 5 minutes, preferably at 80 to 120° C. for 1 to 3 minutes.

Thereafter the resist film is developed with a developer in the form of an aqueous alkaline solution, for example, an aqueous solution of 0.1 to 5 wt %, preferably 2 to 3 wt % TMAH for 0.1 to 3 minutes, preferably 0.5 to 2 minutes by conventional techniques such as dip, puddle and spray techniques. In this way, a desired resist pattern is formed on the substrate.

Like the first resist composition, the second resist composition is coated, exposed and developed in a standard way. In one preferred embodiment, the second resist pattern is formed in an area where features of the first resist pattern have not been formed, thereby reducing the distance between pattern features to one half. The conditions of exposure and development and the thickness of the second resist film may be the same as described above.

Next, using the inactivated first resist film and the second resist film as a mask, the intermediate intervening layer of hard mask or the like is etched, and the processable layer further etched. For etching of the intermediate intervening layer of hard mask or the like, dry etching with fluorocarbon or halogen gases may be used. For etching of the processable layer, the etching gas and conditions may be properly chosen so as to establish an etching selectivity relative to the hard mask, and specifically, dry etching with fluorocarbon, halogen, oxygen, hydrogen or similar gases may be used. Thereafter, the first and second resist films are removed. Removal of these films may be carried out after etching of the intermediate intervening layer of hard mask or the like. It is noted that removal of the first resist film may be achieved by dry etching with oxygen or radicals and removal of the second resist film may be achieved as previously described, or using strippers such as amines, sulfuric acid/aqueous hydrogen peroxide or organic solvents.

EXAMPLE

Examples of the invention are given below by way of illustration and not by way of limitation. For all polymers, Mw and Mn are determined by GPC versus polystyrene standards. The amount "pbw" is parts by weight.

Preparation Examples

Base Resin for Resist

Polymers to be used as the base resin in resist compositions were prepared by combining various monomers in 2-butanone medium, effecting copolymerization reaction in the presence of dimethyl 2,2-azobis(2-methylpropionate) as a radical polymerization initiator, crystallization in hexane, repeated washing, and vacuum drying. The resulting polymers (Polymers 1 to 3) had the composition shown below. The composition of each polymer was analyzed by $^1$H-NMR and $^{13}$C-NMR, and the Mw and Mw/Mn determined by GPC.

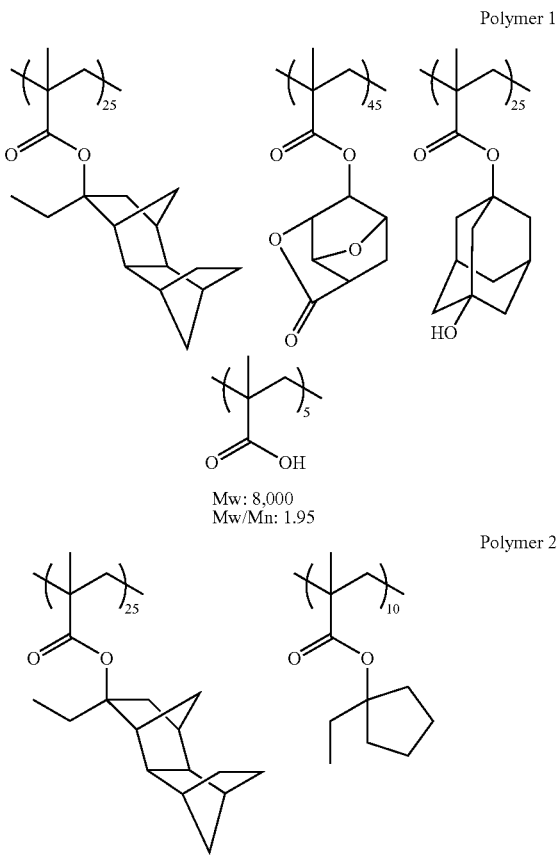

-continued

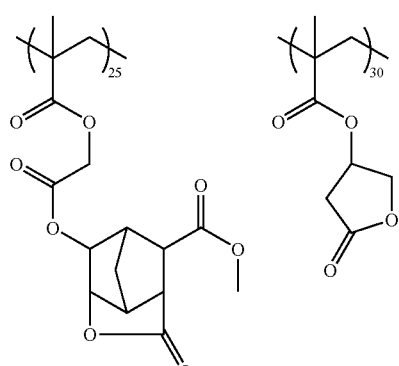
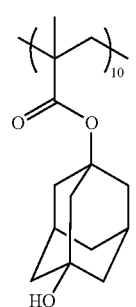
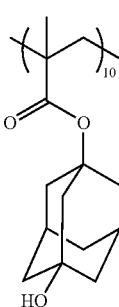

Mw: 7,600
Mw/Mn: 1.57

Polymer 3

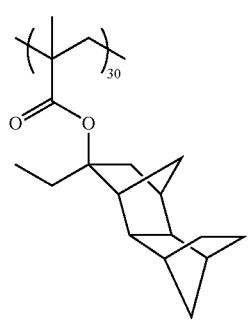
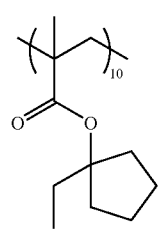
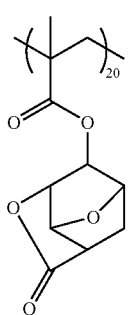

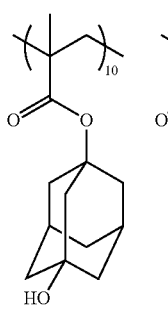
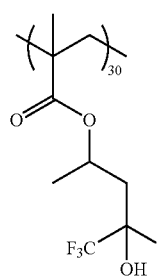

Mw: 8,900
Mw/Mn: 1.74

First and Second Resist Compositions

A resist solution was prepared by dissolving each polymer (Polymers 1 to 3) as a base resin, an acid generator, a basic compound, and a repellent (for rendering the resist film surface water repellent) in a solvent in accordance with the recipe shown in Table 1, and filtering through a Teflon® filter with a pore size of 0.2 μm. The solvent contained 50 ppm of surfactant FC-4430 (3M-Sumitomo Co., Ltd.).

The components in Table 1 are identified below.

Acid generator: PAG1 of the following structural formula

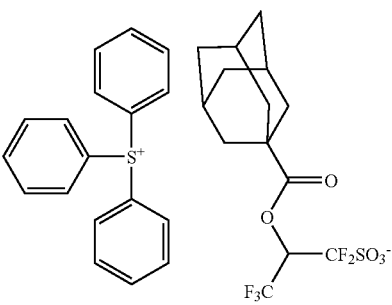

PAG1

Basic compound: Quencher 1 of the following structural formula

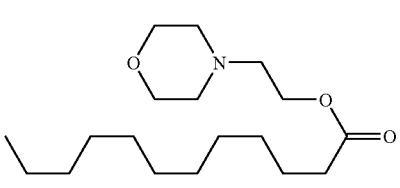

Quencher 1

Repellent: Repellent Polymers 1 and 2 of the following formulae

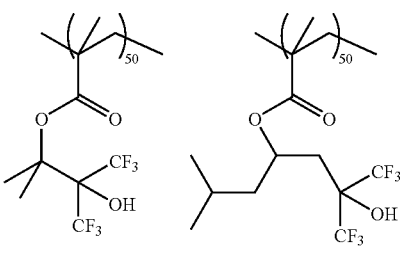

Repellent Polymer 1

Mw 8,900
Mw/Mn 1.96

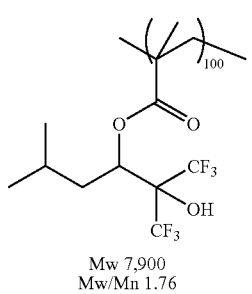

Repellent Polymer 2

Mw 7,900
Mw/Mn 1.76

Organic solvent: PGMEA (propylene glycol monomethyl ether acetate)

TABLE 1

| | Base resin (pbw) | Acid generator (pbw) | Basic compound (pbw) | Repellent (pbw) | Organic solvent (pbw) |
|---|---|---|---|---|---|
| Resist 1 | Polymer 1 (80) | PAG 1 (12.7) | Quencher 1 (2.0) | Repellent Polymer 1 (3.0) | PGMEA (1,680) cyclohexanone (720) |
| Resist 2 | Polymer 2 (80) | PAG 1 (12.7) | Quencher 1 (2.0) | Repellent Polymer 1 (3.0) | PGMEA (1,680) cyclohexanone (720) |
| Resist 3 | Polymer 3 (80) | PAG 1 (12.7) | Quencher 1 (2.0) | Repellent Polymer 2 (3.0) | 2-methylbutanol (2,400) |

Resist-Modifying Composition

Resist-modifying compositions A to F were prepared by mixing a polymer (Polymers 4 to 8, shown below) as a base resin, a nitrogen-containing organic compound and a solvent in accordance with the recipe shown in Table 2, and filtering through a Teflon® filter with a pore size of 0.2 μm.

Polymers were prepared by combining various monomers in isopropyl alcohol medium, effecting copolymerization reaction in the presence of dimethyl 2,2-azobis(2-methylpropionate) as a radical polymerization initiator, crystallization in hexane or the like, repeated washing, and vacuum drying. The resulting polymers (Polymers 4 to 7) had the composition shown below. The composition of each polymer was analyzed by $^1$H-NMR and $^{13}$C-NMR, and the Mw and Mw/Mn determined by GPC. Polymer 8 is polyvinyl pyrrolidone with Mw=10,000 commercially available from Aldrich.

Polymer 4

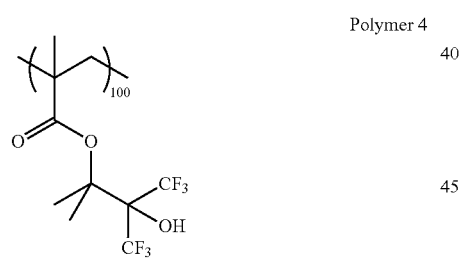

Mw: 8,900
Mw/Mn: 1.59
Fluorine content: 39 wt %

Polymer 8 (polyvinyl pyrrolidone)

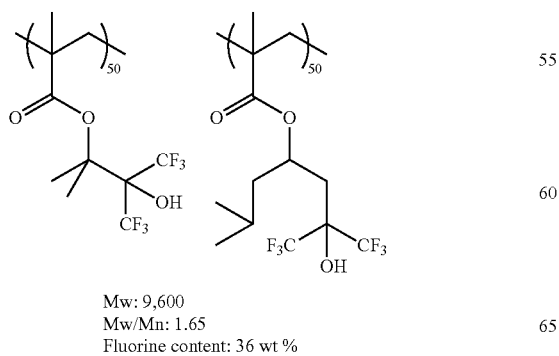

Mw: 9,600
Mw/Mn: 1.65
Fluorine content: 36 wt %

-continued

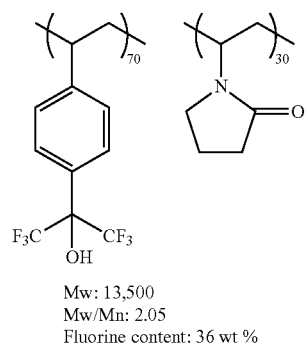

Mw: 13,500
Mw/Mn: 2.05
Fluorine content: 36 wt %

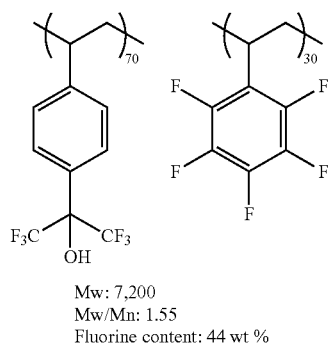

Mw: 7,200
Mw/Mn: 1.55
Fluorine content: 44 wt %

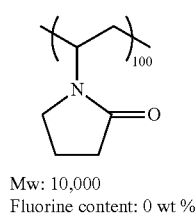

Mw: 10,000
Fluorine content: 0 wt %

The components in Table 2 are identified below.
Nitrogen-containing organic compounds:

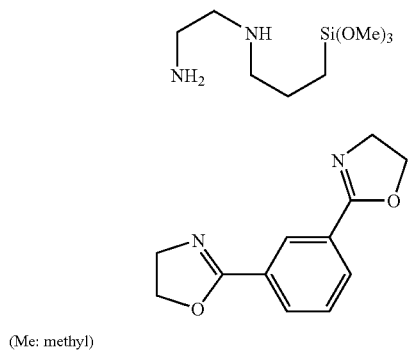

N-1

N-2

(Me: methyl)

Solvent: IBA (isobutyl alcohol)

TABLE 2

| Resist-modifying composition | Base resin (pbw) | Nitrogen-containing organic compound (pbw) | Solvent (pbw) |
| --- | --- | --- | --- |
| A | Polymer 4 (80) | N-1 (20) | IBA (3,800)/Water (200) |
| B | Polymer 4 (80) | N-1 (13)/ N-2 (3) | IBA (3,800)/Water (200) |
| C | Polymer 5 (80) | N-1 (13)/ N-2 (3) | IBA (3,800)/Water (200) |
| D | Polymer 6 (80) | N-1 (20) | IBA (3,800)/Water (200) |
| E | Polymer 7 (80) | N-1 (20) | IBA (3,920)/Water (80) |
| F | Polymer 8 (80) | N-1 (20) | IBA (3,800)/Water(200) |

Reference Example

Measurement of Contact Angle

Wafer 1 was prepared by coating a silicon wafer with an antireflective coating (ARC-29A, Nissan Chemical Industries, Ltd.) of 80 nm thick. Wafer 2 was prepared by spin coating. Resist 1 on Wafer 1 and baking on a hot plate at 100° C. for 60 seconds to form a resist film of 80 nm thick. A contact angle with pure water was measured using an automatic contact angle meter DM-500 (Kyowa Interface Science Co., Ltd.) and a water droplet of 5 μL. Wafers 1 and 2 prior to modifying treatment had a contact angle with pure water of 61.3° and 61.1°, respectively.

Next, each of resist-modifying compositions A to F in Table 2 was coated on Wafers 1 and 2, soft-baked at 100° C. for 60 seconds, developed with 2.38 wt % TMAH aqueous solution, and rinsed with deionized water. This was followed by hard baking at 140° C. for 60 seconds to complete wafer samples. A contact angle with pure water was measured again, with the results shown in Table 3.

TABLE 3

| Resist-modifying composition | Contact angle of Wafer 1 after modification, deg | Contact angle of Wafer 2 after modification, deg | Difference of contact angle of Wafer 2 before and after modification, deg |
| --- | --- | --- | --- |
| A | 50.0 | 57.4 | 3.7 |
| B | 50.6 | 58.0 | 3.1 |
| C | 52.3 | 59.5 | 1.6 |
| D | 48.8 | 56.2 | 4.9 |
| E | 58.2 | 65.2 | 4.1 |
| F | 42.5 | 49.6 | 11.5 |

Examples and Comparative Examples

Double Patterning Test

On a substrate (silicon wafer) having an antireflective coating (ARC-29A, Nissan Chemical Industries Ltd.) of 80 nm thick, Resist 1 in Table 1 was spin coated, then baked on a hot plate at 100° C. for 60 seconds to form a resist film of 80 nm thick. Using an ArF excimer laser scanner model NSR-S610C (Nikon Corp., NA 1.30, σ 0.98/0.78, 20° dipole illumination, s-polarized illumination, 6% halftone phase shift mask), the coated substrate was exposed to a Y-direction 36-nm line/144-nm pitch pattern. Immediately after exposure, the resist film was baked (PEB) at 100° C. for 60 seconds and then developed for 30 seconds with a 2.38 wt % TMAH aqueous solution, obtaining a first line-and-space pattern having a line size of 36 nm.

The resist-modifying composition shown in Table 2 was coated on the first resist pattern and baked at 100° C. for 60 seconds. It was developed for 10 seconds with a 2.38 wt % TMAH aqueous solution, rinsed with deionized water, and baked at 140° C. for 60 seconds, completing modification treatment of the first pattern.

Figure 5:
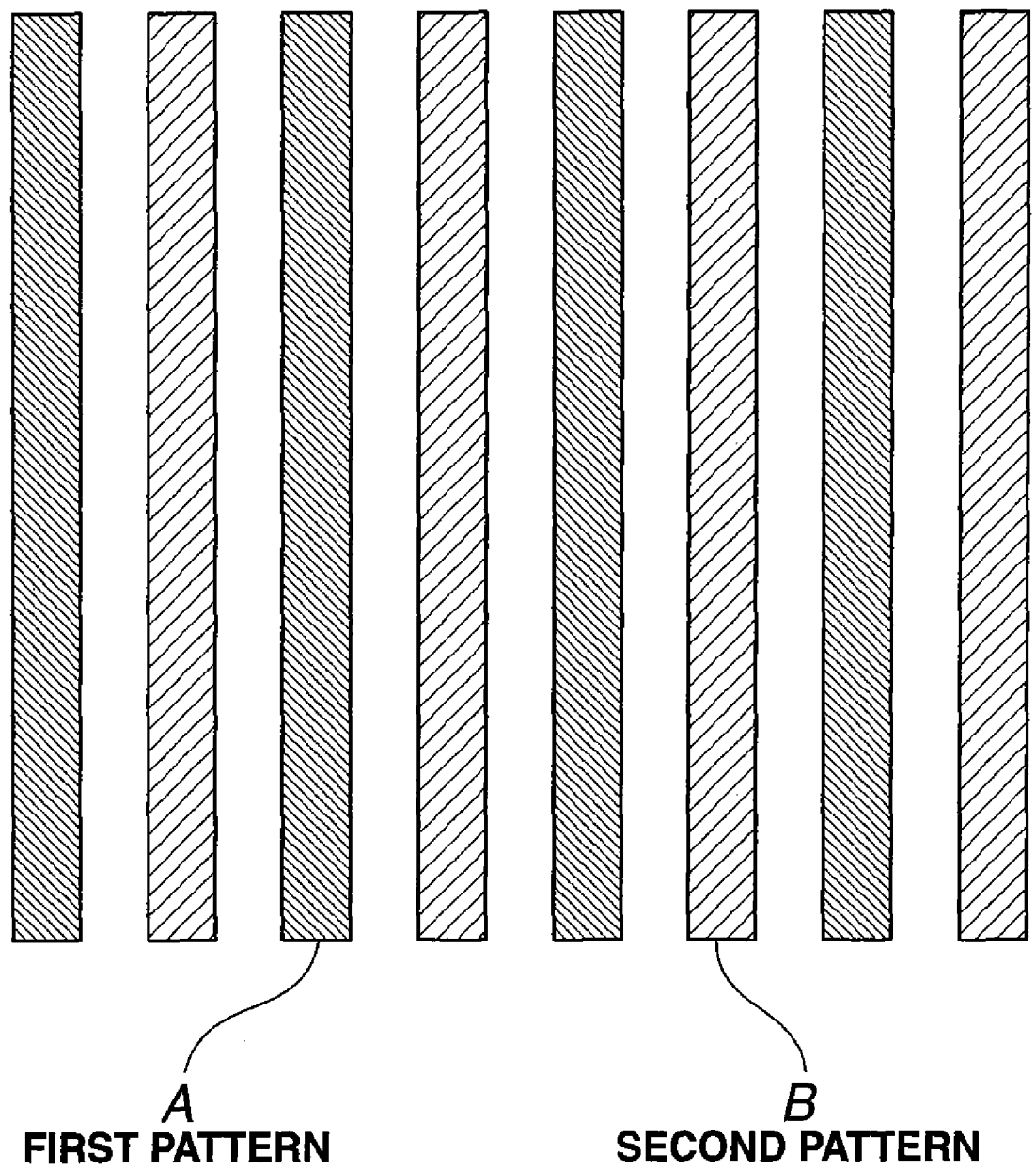
FIG. 5 is a plan view of a resist pattern formed in the double patterning test in Examples.

Next, Resist 2 or 3 in Table 1 was coated onto the first resist pattern-bearing substrate and baked at 90° C. (Resist 2) or 100° C. (Resist 3) for 60 seconds. Using an ArF excimer laser scanner model NSR-S610C (Nikon Corp., NA 1.30, σ 0.98/0.78, 20° dipole illumination, s-polarized illumination, 6% halftone phase shift mask), the coated substrate was exposed to a Y-direction 36-nm line/144-nm pitch pattern which was shifted 72 nm from the first pattern in X direction. Immediately after exposure, the second resist film was baked (PEB) at 80° C. (Resist 2) or 85° C. (Resist 3) for 60 seconds and then developed for 30 seconds with a 2.38 wt % TMAH aqueous solution, obtaining a 1:1 line-and-space pattern having a line size of 36 nm as a combination of first and second patterns. There were formed parallel extending first pattern lines A and second pattern lines B as illustrated in FIG. 5. The line width of the first and second patterns was measured by a measuring SEM (S-9380, Hitachi, Ltd.). The results are also shown in Table 4.

TABLE 4

| | 1st Resist composition | Resist-modifying composition | 2nd Resist composition | Size of 1st pattern as developed | Size of 1st pattern after formation of 2nd pattern | Size of 2nd pattern as developed |
|---|---|---|---|---|---|---|
| Example 1 | Resist 1 | A | Resist 2 | 36 nm | 37 nm | 36 nm |
| Example 2 | Resist 1 | B | Resist 2 | 36 nm | 37 nm | 36 nm |
| Example 3 | Resist 1 | B | Resist 3 | 36 nm | 37 nm | 36 nm |
| Example 4 | Resist 1 | C | Resist 2 | 36 nm | 37 nm | 36 nm |
| Example 5 | Resist 1 | D | Resist 2 | 36 nm | 39 nm | 36 nm |
| Example 6 | Resist 1 | E | Resist 2 | 36 nm | 37 nm | 36 nm |
| Comparative Example 1 | Resist 1 | F | Resist 2 | 36 nm | pattern collapsed | 36 nm |
| Comparative Example 2 | Resist 1 | F | Resist 3 | 36 nm | pattern collapsed | 36 nm |

It is seen from the data in Table 4 that in Examples, the first pattern remained substantially unchanged after the second pattern was formed. In Comparative Examples, the first pattern collapsed and vanished. A cross-section of the sample after second pattern formation was observed under SEM. In Comparative Examples, residues were observed in the areas which are designed to be spaces, and the second pattern had a noticeable footing profile. In Examples, no residues were observed and the second pattern was substantially rectangular.

The pattern forming process and the resist-modifying composition of the invention are advantageously applicable to the double patterning process of processing a substrate through two exposures and a single dry etching. Particularly when applied to the double patterning process of forming a second resist line pattern in spaces of a first resist line pattern in parallel for reducing the distance between lines of the resist patterns, the invention overcomes the problems of pattern collapse and development defects.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2009-035367 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention caimed is:

1. A process for forming a pattern, comprising the steps of:
(1) coating a first positive resist composition comprising a polymer comprising recurring units adapted to increase alkali solubility under the action of acid and recurring units having lactone structure onto a substrate and baking to form a first resist film, exposing the first resist film to high-energy radiation, post-exposure baking, and developing the first resist film with an alkaline developer to form a first resist pattern composed mainly of lines, (2) applying a resist-modifying composition to the first resist pattern and heating to modify the first resist pattern, (3) coating a second positive resist composition onto the modified first resist pattern and baking to form a second resist film, exposing the second resist film to high-energy radiation, post-exposure baking, and developing the second resist film with an alkaline developer to form a second resist pattern composed mainly of lines parallel to the first resist pattern, for thereby reducing the distance between resist pattern lines, the first resist pattern in the unexposed area resulting from modifying step (2) having a contact angle with pure water of 50 to 85 degrees;

wherein said resist-modifying composition comprises a base resin which is soluble in alkaline developer and non-soluble in water, the base resin having a fluorine atom content of 15 to 55% by weight, a nitrogen-containing organic compound, and a solvent;

wherein the base resin comprises recurring units having the general formula (1) or (2):

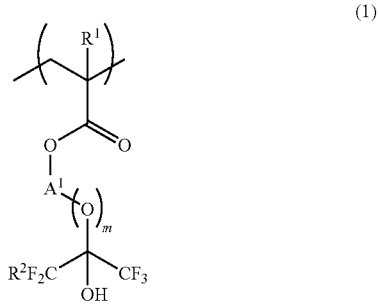

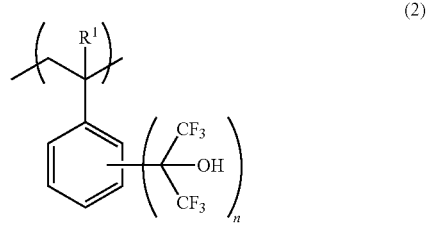

wherein $A^1$ is a straight, branched or cyclic $C_1$-$C_{15}$ alkylene or alkylidene group which may contain fluorine or hydroxyl or both, $R^1$ is hydrogen or methyl, $R^2$ is hydrogen or fluorine, or $R^2$ may be a single bond to $A^1$ wherein the moiety $A\text{-}(O)_m\text{—}C\text{—}CF_2$ is an alicyclic or ether ring, m is equal to 0 or 1, and n is equal to 1 or 2; and wherein said resist-modifying composition comprises an aminosilane compound as the nitrogen-containing organic compound.

2. The process of claim 1 wherein the first resist pattern in the unexposed area prior to modifying step (2) having a contact angle with pure water of X degrees and the first resist pattern in the unexposed area resulting from modifying step (2) having a contact angle with pure water of Y degrees, and the magnitude of the difference between X and Y is not more than 10 degrees.

3. The process of claim 1 wherein the substrate after modifying step (2) has a contact angle with pure water of 45 to 85 degrees.

4. The process of claim 1 wherein the base resin comprises recurring units having the general formula (1) or (2) and nitrogen-containing recurring units in an amount of up to 40 mol % based on the entire recurring units.

5. The process of claim 1 wherein said resist-modifying composition further comprises a non-silicon crosslinker.

6. The process of claim 1 wherein said aminosilane compound has the general formula (3):

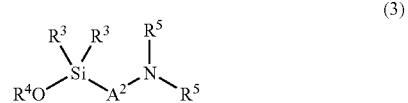

(3)

wherein $A^2$ is a straight, branched or cyclic $C_2$-$C_{20}$ alkylene group, $C_6$-$C_{10}$, arylene group or $C_7$-$C_{16}$ aralkylene group which may contain a hydroxyl, ether or amino group, $R^3$ is each independently $C_1$-$C_4$ alkyl or $OR^4$, $R^4$ is hydrogen or $C_1$-$C_6$ alkyl, $R^5$ is each independently hydrogen, or a $C_1$-$C_4$ alkyl group which may contain a hydroxyl or ether group, or two $R^5$ may bond together to form a ring with the nitrogen atom to which they are attached.

* * * * *